United States Patent

Mizoguchi et al.

[11] Patent Number: 5,831,293
[45] Date of Patent: Nov. 3, 1998

[54] SEMICONDUCTOR THYRISTOR SWITCHING DEVICE AND POWER CONVERTER USING SAME

[75] Inventors: Tetsuo Mizoguchi, Hitachi; Masahiro Nagasu, Hitachinaka; Hideo Kobayashi; Tsutomu Yatsuo, both of Hitachi, all of Japan

[73] Assignee: Hitachi, Ltd., Tokyo, Japan

[21] Appl. No.: 709,451

[22] Filed: Sep. 6, 1996

Related U.S. Application Data

[63] Continuation of Ser. No. 497,439, Jun. 30, 1995, abandoned.

[30] Foreign Application Priority Data

Jun. 30, 1994 [JP] Japan ..................................... 6-148972

[51] Int. Cl.⁶ ............................ H01L 29/74; H01L 31/111
[52] U.S. Cl. ......................... 257/147; 257/149; 257/152; 257/153
[58] Field of Search .................................... 257/149, 151, 257/147, 152, 153

[56] References Cited

U.S. PATENT DOCUMENTS

| 4,170,502 | 10/1979 | Watakabe | 257/147 |
| 5,324,967 | 6/1994 | Honma et al. | 257/147 |
| 5,336,907 | 8/1994 | Nakanishi et al. | 257/153 |

FOREIGN PATENT DOCUMENTS

| 0178387 | 4/1986 | European Pat. Off. | 257/153 |
| 61-100966 | 5/1986 | Japan . | |

OTHER PUBLICATIONS

The Sixth SI Device Symposium (Jan. 1993), SID–92–(1)–1, pp. 1–6.

*Primary Examiner*—Wael Fahmy
*Attorney, Agent, or Firm*—Antonelli, Terry, Stout & Kraus, LLP

[57] ABSTRACT

There is provided a semiconductor substrate which includes a pair of main surfaces, a first semiconductor layer of a first conductivity type adjacent to one of the main surface, a second semiconductor layer of a second conducting type of which impurity concentration is lower than that of the first semiconductor layer and which is adjacent to the first semiconductivity, a third semiconductor layer of the first conductivity type adjacent to the second semiconductor, and a fourth semiconductor of the second conductivity type of which impurity concentration is higher than that of the third semiconductor and which is adjacent to the other of the main surfaces and the third semiconductor. The device further includes one main electrode in ohmic-contact with the first semiconductor layer on one of the main surfaces of said semiconductor substrate, the other main electrode in ohmic-contact with the first semiconductor layer on the other of the main surfaces of said semiconductor substrate, and a control electrode connected electrically to the third semiconductor layer. The total amount of impurities of said third semiconductor layer is less than $10^{14} cm^{-2}$.

14 Claims, 23 Drawing Sheets

$Q < 10^{12}$ cm$^{-2}$ $Q \geq 10^{12}$ cm$^{-2}$

|  | THICKNESS ($\mu$m) | MAXIMUM IMPURITY CONCENTRATION ($\times 10^{15}$cm$^{-3}$) | Q($\times 10^{12}$cm$^{-2}$) | Q'($\times 10^{11}$cm$^{-2}$) | Q''($\times 10^{12}$cm$^{-2}$) |
|---|---|---|---|---|---|
| CONDITION A | 28 | 1.5 | 1.5 | 2 | 1 |
| CONDITION B | 30 | 4 | 4 | 5 | 3 |
| CONDITION C | 33 | 7 | 8 | 12 | 7 |

DEPTH OF GROOVE : 20$\mu$m    12:2$\mu$m
MAXIMUM IMPURITY CONCENTRATION IN GATE p$^+$ LAYER : 5$\times 10^{19}$cm$^{-3}$ X ---- POSITION WHERE ELECTRIC FIELD IS MAXIMUM
EQUIPOTENTIAL LINE : 20V/div
$Q' > 10^{12} cm$, $Q'' > 8 \times 10^{11} cm$ MAXIMUM ELECTRIC FIELD VALUE : $2.2 \times 10^7$ (V/m)

$Q' < 1.2 \times 10^{11} cm^{-2}$

MAXIMUM ELECTRIC FIELD VALUE : $1.9 \times 10^7$ (V/m)

$Q' > 1.2 \times 10^{11} cm^{-2}$

MAXIMUM ELECTRIC FIELD VALUE : $1.6 \times 10^7$ (V/m)

$Q' > 1.2 \times 10^{11} cm^{-2}$

CONVENTIONAL SI THYRISTOR

| CONDITION D | THICKNESS (μm) | : 29 |
|---|---|---|
| | MAXIMUM IMPURITY CONCENTRATION ($\times 10^{15}$ cm$^{-3}$) | : 1 |
| | Q ($\times 10^{12}$ cm$^{-2}$) | : 3 |
| | Q' ($\times 10^{11}$ cm$^{-2}$) | : 13 |
| | Q" ($\times 10^{12}$ cm$^{-2}$) | : 1.2 |
| | DEPTH OF GROOVE | : 20 μm, l$_2$ : 2 μm |
| | MAXIMUM IMPURITY CONCENTRATION IN GATE p$^+$ LAYER | : 5 $\times 10^{19}$ cm$^{-3}$ |

|  | THICKNESS ($\mu$m) | MAXIMUM IMPURITY CONCENTRATION ($\times 10^{15}$ cm$^{-3}$) | Q($\times 10^{12}$cm$^{-2}$) | Q'($\times 10^{11}$cm$^{-2}$) | Q''($\times 10^{12}$cm$^{-2}$) |
|---|---|---|---|---|---|
| CONDITION E | 35 | 2 | 4 | 9 | 1.7 |
| CONDITION F | 36 | 4 | 6.5 | 20 | 1.7 |
| CONDITION G | 37 | 8 | 10 | 36 | 1.7 |

SEMICONDUCTOR THYRISTOR SWITCHING DEVICE AND POWER CONVERTER USING SAME

This is a continuation of application Ser. No. 08/497,439, filed Jun. 30, 1995 now abandoned.

BACKGROUND OF THE INVENTION

The present invention relates to a semiconductor device particularly suitable for use in high circuits and in large power equipment.

In the fields of traffic control, industrial use and electric power, it is required to develop a high performance gate-turn-off switching device capable of operating under several kilo-volts and several kilo-amperes. While there is mainly known a GTO thyristor (Gate Turn off thyristor, hereinafter referred-to merely as a GTO) as the thyristor of such a type, an SI (Static Induction) thyristor can be used in frequencies higher than the operating frequency of the GTO. This is disclosed, for example, in the papers, from the 6th SI device symposium (January 1993), SID-92-(1)-1, pages 1 to 6. When the device is operated in the high frequencies, the power loss generated in the device when switched, that is, the switching loss, increases in proportion to the frequency. Because the problem that the temperature of the device may increase due to the switching loss is very hard to overcome, it is required to decrease a turn-off loss, that is, the loss made when a current is turned off, which is a large part of the overall switching loss. In order to decrease the turn-off loss, thus cut off a period of the turn-off, it is effective to cut off the lifetime of carriers by emitting an electron beam or a λ ray to the device so as to speed up the disappearance of the carriers. However, if the lifetime is cut off, the amount of the carriers in a stationary on-state is decreased. Therefore, the potential drop of the device occurs, thus the on-voltage increases. As a result, the stationary state loss when in the on-state or the on-state loss increases. As seen from the matter described above, there is a trade-off relationship between the turn-off loss and the on-state loss. Accordingly, in high frequencies, it is desirable to use such a device that can inhibit the increase of the on-voltage and can decrease the turn-off loss.

From the above point of view, the GTO thyristor and the SI thyristor will be compared with each other.

The GTO has a p base layer with high impurity concentration. If the lifetime of carriers is cut off to a certain extent, that of the carriers in the p base layer also becomes short. Therefore, the number of electrons extremely decreases, which is injected from a cathode and can arrive at an n base layer through the p base layer. Accordingly, even if the turn-off loss can be decreased to a certain extent, an undesirable effect such as the sudden increase of the on-voltage occurs strongly with it. While, because the SI thyristor does not have a p base layer with the high impurity concentration, it is possible to decrease the turn-off loss by cutting off the lifetime, with suppressing the increase of the on-voltage. Because, in the SI thyristor, the injection efficiency of an electron is very high, the loss becomes lower. In addition, it is possible to decrease further the loss by increasing the carrier concentration on the side of the cathode in an n−layer more than that on the side of the anode.

However, there are some problems on the blocking voltage of a thyristor with a high blocking voltage, of which the rated voltage is more than 4.5 kV. Because the SI thyristor does not have the layer corresponding to the p base layer of the GTO, an anode voltage is blocked by forming a negative potential barrier in a channel due to a gate potential. Therefore, if a high inverse bias voltage is not applied to the gate, the high anode voltage can be blocked. In addition, because the SI thyristor does not have the layer corresponding to the p base layer of the GTO and it is impossible to accept the anode voltage by a horizontal pn junction, it is difficult to make a device with a high blocking voltage. Further, because in the SI thyristor, depletion layers pinch the channel, expanding from the p-type gate layers next to each other through the channel and thus block the anode voltage, the width of the channel may effect greatly on the blocking voltage. In other words, the dispersion of the work of the p-type gate layer may affect greatly on the blocking voltage. If there is such a portion in the device where the blocking voltage is low, the blocking voltage of the whole device may be limited within that of the portion. It is, therefore, difficult to obtain the desired blocking voltage with good yield.

There is shown the conventional method of improving the characteristic of the blocking voltage of the SI thyristor in Japanese Patent Application Laid-Open No.61-100966 (1986), in which means for providing the p-layer with low concentration adjacent to the p-type gate layer. However, if the concentration of the provided p-layer is unexpectedly low or the distribution of the concentration is not considered, the effect of the blocking voltage improvement cannot be expected. In this prior art, when the anode voltage is low and the contact of the gate is opened, the corresponding space charge region reaches an n+ emitter. Thereby, the thyristor can be switched. Namely, the total amount of the impurities in the p-layer with low concentration is suppressed so as to indicate the normally-on characteristic. If the circuit between the gate terminal and the cathode terminal is unwillingly opened or short-circuited when the anode voltage is blocking by the application of an inverse bias to the gate under the condition of the low concentration p-layer, it becomes impossible to block a high anode voltage, thus the device is apt to make a mistake in operation.

SUMMARY OF THE INVENTION

The present invention is made under the consideration of the above-mentioned problems.

An object of the present invention is to provide a semiconductor device which has both the characteristics of a high blocking voltage and a lower power loss.

The summary of the invention will be explained hereinafter, where the concentration of impurities designates an absolute value of the difference between the concentration of acceptor impurities and that of donor impurities, the substantial concentration of impurities. Further, the total amount of impurities designates the amount corresponding to the substantial concentration of impurities.

A semiconductor device of the present invention is provided with a semiconductor substrate which includes a pair of main surfaces, a first semiconductor layer of a first conductivity type adjacent to one of the main surfaces, a second semiconductor layer of a second conductivity type of which impurity concentration is lower than that of the first semiconductor layer and which is adjacent to the first semiconductor layer, a third semiconductor layer of the first conductivity type adjacent to the second semiconductor layer, and a fourth semiconductor layer of the second conductivity type of which impurity concentration is higher than that of the third semiconductor layer and which is adjacent to the other of the main surfaces and the third semiconductor layer.

The semiconductor device according to the present invention further includes one main electrode in ohmic-contact with the first semiconductor layer on one of the main surfaces of said semiconductor substrate, the other main electrode being in ohmic-contact with the fourth semiconductor layer on the other of the main surfaces of said semiconductor substrate, and a control electrode being connected electrically to the third semiconductor layer.

Further, the total amount of impurities of said third semiconductor layer, located between said second semiconductor layer and said fourth semiconductor layer, is less than $10^{14} cm^{-2}$.

In the semiconductor device according to one of the preferred embodiments of the present invention, the total amount of the impurities of the third semiconductor layer, located between the second semi-conductor layer and the fourth semiconductor layer, is in the range of $10^{12} cm^{-2}$ to $10^{14} cm^{-2}$.

According to the present invention, it is possible to improve the blocking voltage, because the applied voltage can be blocked by a junction of the second semiconductor layer of the second conductivity type and the third semiconductor layer of the first conductivity type in an off-state. It is further possible to increase the amount of carriers injected from the fourth semiconductor layer to the second semiconductor layer, because the transport factor of the carriers is improved in the third semiconductor layer by setting the total amount of the impurities of the third semiconductor so as to be less than $10^{14} cm^{-2}$, which is provided between the second semiconductor layer and the fourth semiconductor layer. As a result, it becomes possible to suppress the on-voltage so as to be low due to the cut-off of the lifetime of the carriers, even if the turn-off loss is decreased. Namely, the semiconductor device according to the present invention has both the characteristics of a low on-voltage and a low turn-off loss.

Further, according to the present invention, the total amount of the impurities of the third semiconductor layer between the second semiconductor layer and the fourth semiconductor layer is in the range of $10^{12} cm^{-2}$ to $10^{14} cm^{-2}$. It is possible to block a voltage regardless of the presence or absence of a signal or the polarity of a control electrode, by setting the total amount of the impurities of the third semiconductor layer so as to be equal to or more than $10^{12} cm^{-2}$, and obtain a normally-off characteristic.

DESCRIPTION OF THE PREFERRED EMBODIMENTS

Figure 1A:
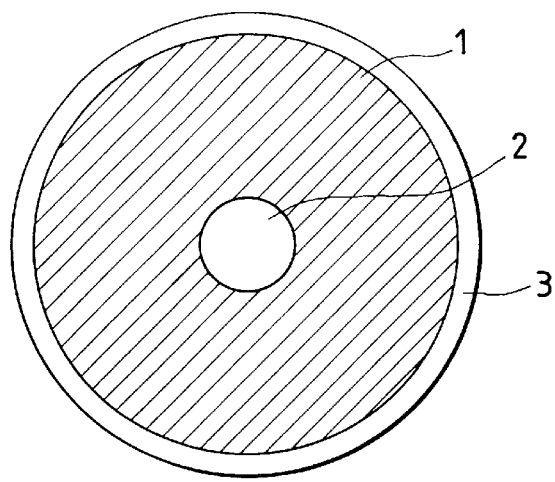
FIG. 1A is a plan view of the whole device of a recessed gate type according to a first embodiment of the present invention.
Figure 1B:
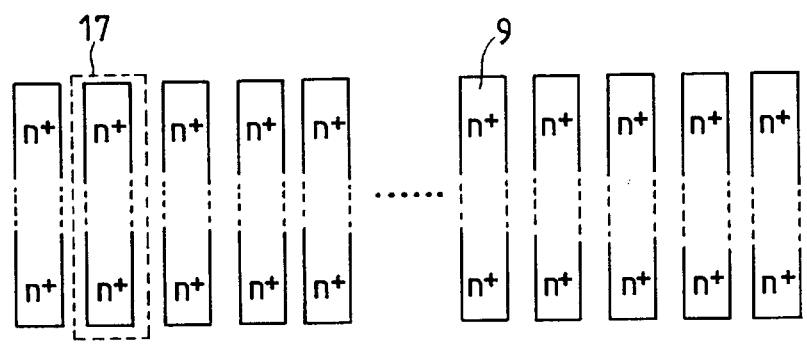
FIG. 1B is a plan view of a segment of the recess gate type device.
Figure 1C:
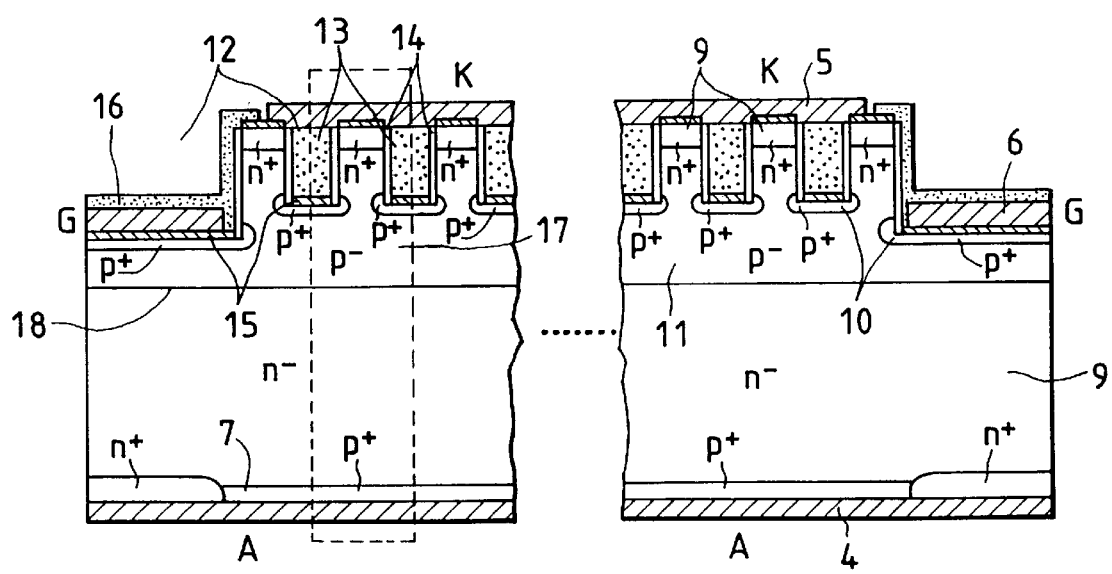
FIG. 1C is a sectional view of a segment of the recess gate type device.
Figure 2A:
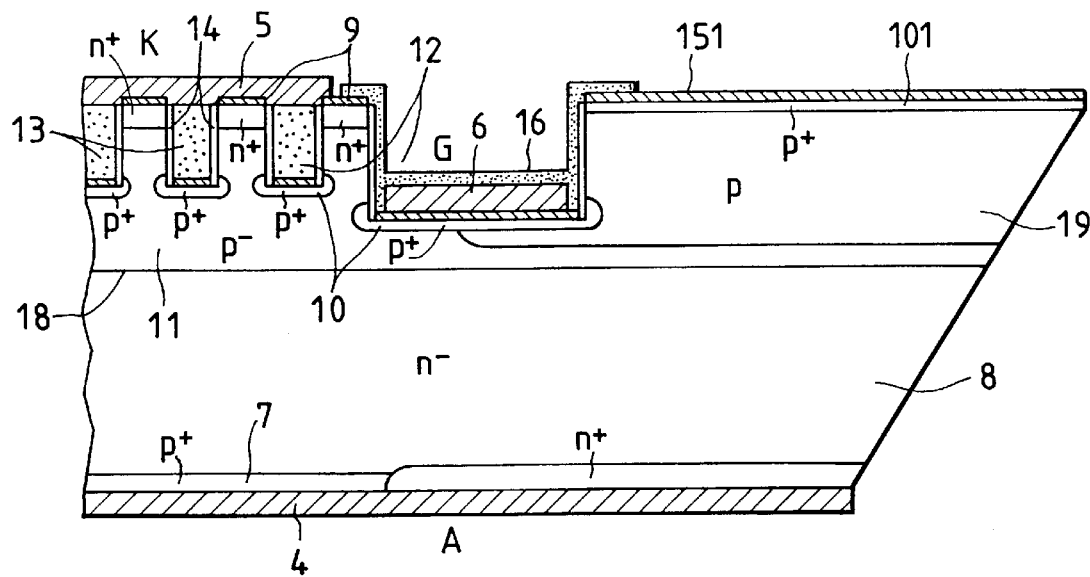
FIG. 2A is a sectional view of a peripheral region of the recess gate type device according to the first embodiment of the present invention.
Figure 2B:
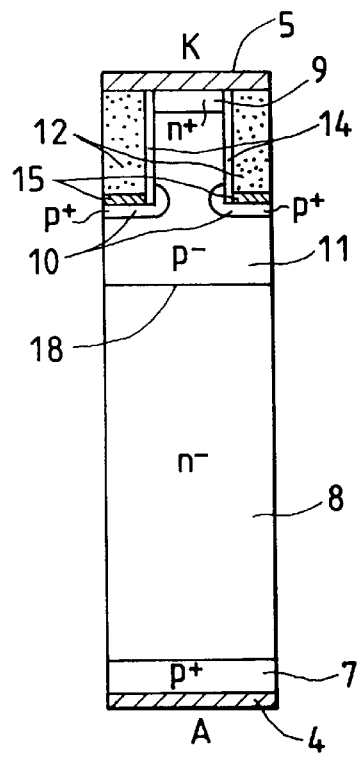
FIG. 2B is a sectional view of a unit element.

FIGS. 1 and 2 show the structure of a 4.5 kV device or element according to an embodiment of the present invention. FIG. 1A shows a schematic plane pattern, FIG. 1B a sub-unit of a semiconductor device or the plane pattern of a segment, and FIG. 1C a schematic sectional view of the structure of the segment. FIG. 2A shows a schematic sectional view of the structure of the periphery portion of the device, and FIG. 2B the minimum unit of the semiconductor device forming a segment or a schematic sectional view of the unit device. In FIG. 1A, a hatched part 1 has a segment and a gate wiring region.

Like many conventional GTOs, a plurality of segments are arranged radially toward the center of a circle. Numeral 2 designates a gate electrode. The gate wiring in the hatch part 1 is connected to the gate electrode, and pass the gate current through the gate electrode. Numeral 3 is a peripheral region required to obtain the necessary blocking voltage.

Referring now to FIGS. 1B and 1C, there is shown the structure of the segment. The structure in which a gate is provided on the bottom of a groove 12 like this is generally called as a recessed gate type. Hereinafter, the device of a recessed gate type will be referred to as a first embodiment. Numeral 4 designates an anode electrode (a first main electrode), and 5 a cathode electrode (a second main electrode). A gate wiring 6 connected to the gate electrode 2 is provided in the periphery of the segment. The gate wiring 6 functions as a gate electrode to the segment, and is therefore called also a gate electrode (a control electrode). Numeral 7 designates a p+ layer (a first semiconductor layer) for injecting holes, numeral 8 n– layer (a second semiconductor layer) with the impurity concentration lower than that of p+ layer 7, numeral 9 n+ layer (a fourth semiconductor layer) for injecting electrons, numeral 10 a p+ layer of the gate (a fifth semiconductor layer), and numeral 11 p– layer (a third semiconductor layer). The p– layer 11 isolates the n– layer 8 from the gate p+ layer 10 and the cathode n+ layer 9. As described in detail later, the total amount of the impurities of the p– layer 11 between the n– layer 8 and the n+ layer 9 should be less than or equal to $10^{14} \text{cm}^{-2}$.

In the present embodiment, the pn junction 18 of the p– layer 11 and n– layer 8 is in a plane form, and an anode short-circuit structure is adopted. In addition, a groove 12 is provided for forming a gate portion and is filled with a resin 13 such as polyimide. Numeral 14 designates a silicon oxide provided for stabilizing the characteristic of the surface of the side wall of the groove. Numeral 15 designates a silicide layer with a low resistance which functions as the gate wiring in the segment, and 16 a resin layer for passivation of the device. $TiSi_2$ (titanium silicide) can be used as a silicide material.

Figure 23A:
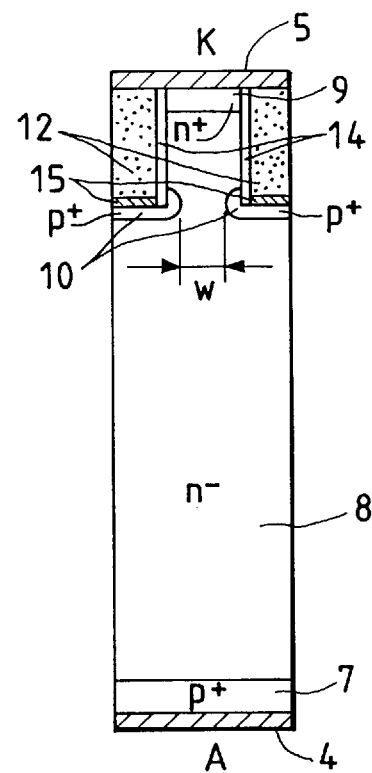
FIG. 23A is a schematic view showing a conventional recessed gate type SI thyristor.
Figure 23B:
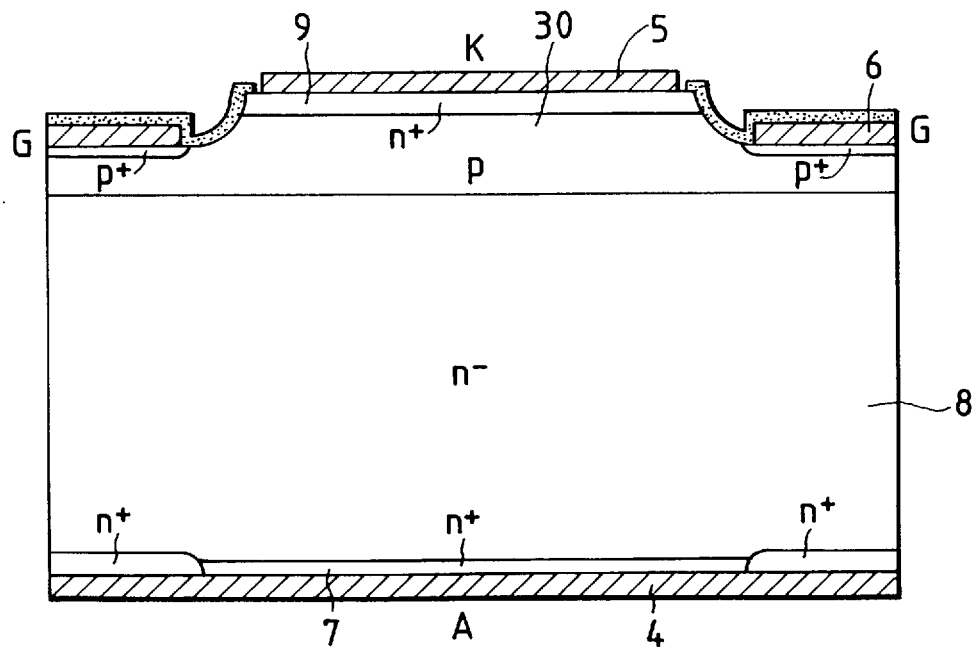
FIG. 23B is a schematic view showing a conventional GTO.

As seen from FIGS. 1A and 1B, the segment has the structure in which a plurality of smaller unit devices 17 are arranged. FIG. 2B shows a section of the unit device. While, FIG. 23A is a sectional view showing the unit device of a conventional recessed gate type SI thyristor, and FIG. 23B is a sectional view showing the unit device of a conventional GTO. The conventional SI thyristor has not the p– layer 11 and the p layer 30 of a conventional GTO has large total amount of the impurities and the impurity concentration higher than that of the p– layer 11 of the present embodiment.

FIG. 3 shows a section in the neighborhood of the cathode 5 of the unit device 17. The definition of the area of the gate p+ layer 10 of the present embodiment will be explained with reference to FIG. 3. The gate p+ layer 10 is formed as a gate layer, has the same conductivity type as the p– layer 11, but has the impurity concentration higher than that of the p– layer 11. Namely, the magnitude of the impurity concentration in this region cannot be disregarded compared with the p– layer 11. The following definition is made in consideration of the above matter.

Figure 3A:
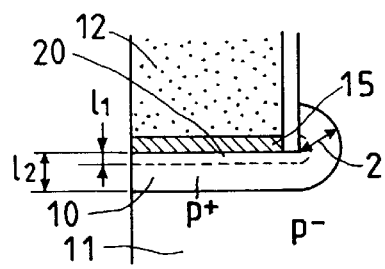
FIGS. 3A to 3F are sectional views of the neighborhood of a cathode of the unit element.

FIG. 3A is an enlarged view showing the neighborhood of a gate wiring layer 15. In the present embodiment, the maximum impurity concentration of the gate p+ layer 10 of the gate adjacent to the gate wiring layer 15 is basically larger than $1 \times 10^{18} \text{cm}^{-3}$. The impurity concentration in region 20 is $1/10$ of the maximum impurity concentration. The distance is set to $I_1$, which is measured from the bottom of the groove 12 to the position nearest to the n– layer 8 of the region 20 (in this case, it is in plane). The gate p+ layer 10 is formed within the region where the distance $I_2$ from the bottom of the groove 12 is smaller than $3 \times I_1$.

Figure 3B:
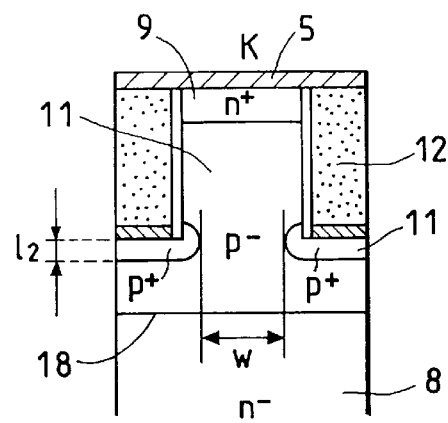

FIG. 3B shows the definition of channel width W. The region between the gate p+ layers 10 is defined as a part of the channel. The shortest distance between the gate p+ layers 10 is defined as channel width W. In the present embodiment, the channel width is set to a value between several $\mu$m and several tens of $\mu$m in order to increase the turn-off capability. the grade of concentration of the gate p+ layer 10 is very large. Accordingly, the defined channel width W can be in fact the same as that defined as the shortest distance between the gate p+ layers 10 in the prior art SI thyristor in which the channel is the n– region 8.

Figure 3C:
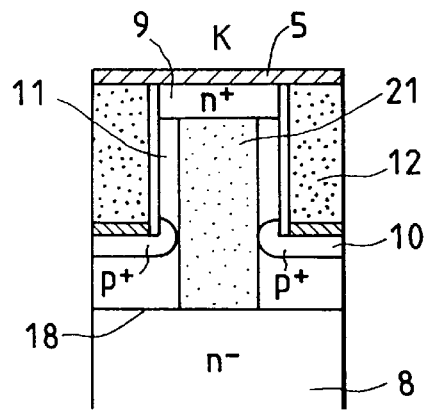
Figure 3D:
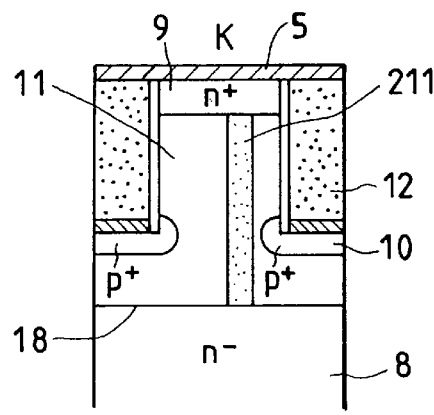

Numeral 21 of FIG. 3C designates the region penetrating through a low concentration layer 11 in a vertical direction. The amount Q converted the total amount of the impurities in this region into the amount per unit area of cross section, is called as the total amount of the impurities in the p– layer 11. It is desired that the value of Q is in the range of smaller than $10^{14} \text{cm}^{-2}$, or larger than $10^{12} \text{cm}^{-2}$ and smaller than $10^{14} \text{cm}^{-2}$, preferably larger than $10^{12} \text{cm}^{-2}$ and smaller than $10^{13} \text{cm}^{-2}$. This value of Q is constant with regard to the region with the arbitrary area and position penetrating the low concentration layer. For example, this region can be selected as numeral 211 of FIG. 3D.

The effect of the total amount Q of the impurities to the characteristics will be explained hereinafter.

Figure 4A:
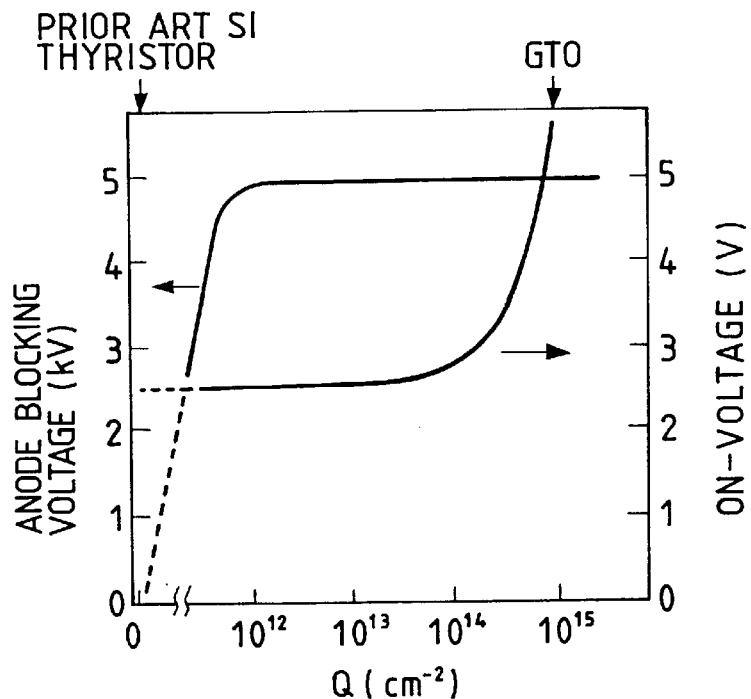
FIG. 4A is a graph representing the relationship between the total amount Q of the impurities and the anode blocking voltage and that between the total amount Q and the on-voltage.

FIGS. 4A is a graph representing the relationship between the total amount Q of the impurities and the anode blocking voltage and that between the total amount Q and the on-voltage. The on-voltage is adjusted substantially to the same value as the turn-off loss. The device which is provided with the p– layer and which satisfies $0 < Q \leq 10^{14} \text{cm}^{-2}$ has an anode blocking voltage much higher than that of the conventional SI thyristor and has the on-voltage much lower than that of the conventional GTO. Further, the device which satisfies $10^{12} \text{cm}^{-2} \leq Q \leq 10^{14} \text{cm}^{-2}$ has especially higher anode blocking voltage. Furthermore, the device which satisfies $10^{12} \text{cm}^{-2} \leq Q \leq 10^{13} \text{cm}^{-2}$ has almost the same low on-voltage as the conventional SI thyristor and has almost the same high blocking voltage as the conventional GTO.

Figure 4B:
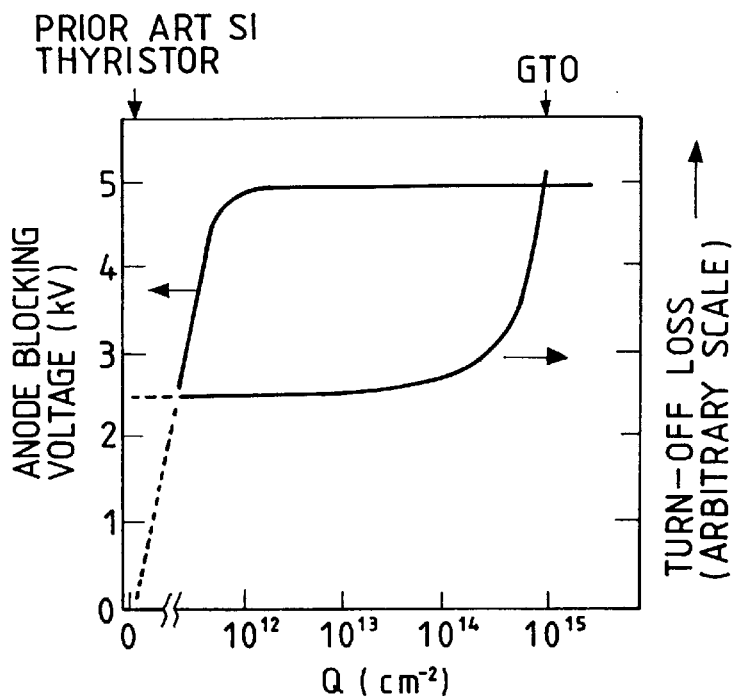
FIG. 4B is a graph representing the relationship between the total amount Q of the impurities and the anode blocking voltage and that between the total amount Q and the turn-off loss.

FIGS. 4B is a graph representing the relationship between the total amount Q of the impurities and the anode blocking voltage and that between the total amount Q and the turn-off loss. The on-voltage is adjusted substantially to the same value as the turn-off loss. The device which is provided with the p– layer and which satisfies $0 < Q \leq 10^{14} \text{cm}^{-2}$ has the anode blocking voltage much higher than that of the conventional SI thyristor and has the turn-off loss much lower than that of the conventional GTO. Further, the device which satisfies $10^{12} \text{cm}^{-2} \leq Q \leq 10^{14} \text{cm}^{-2}$ has especially higher anode blocking voltage. Furthermore, the device which satisfies $10^{12} \text{cm}^{-2} \leq Q \leq 10^{13} \text{cm}^{-2}$ has almost the same low turn-off loss as the conventional SI thyristor and has almost the same high blocking voltage as the conventional GTO.

Next, the reason why the characteristic difference occurs due to the total amount Q of the impurities will be explained.

Figure 5:
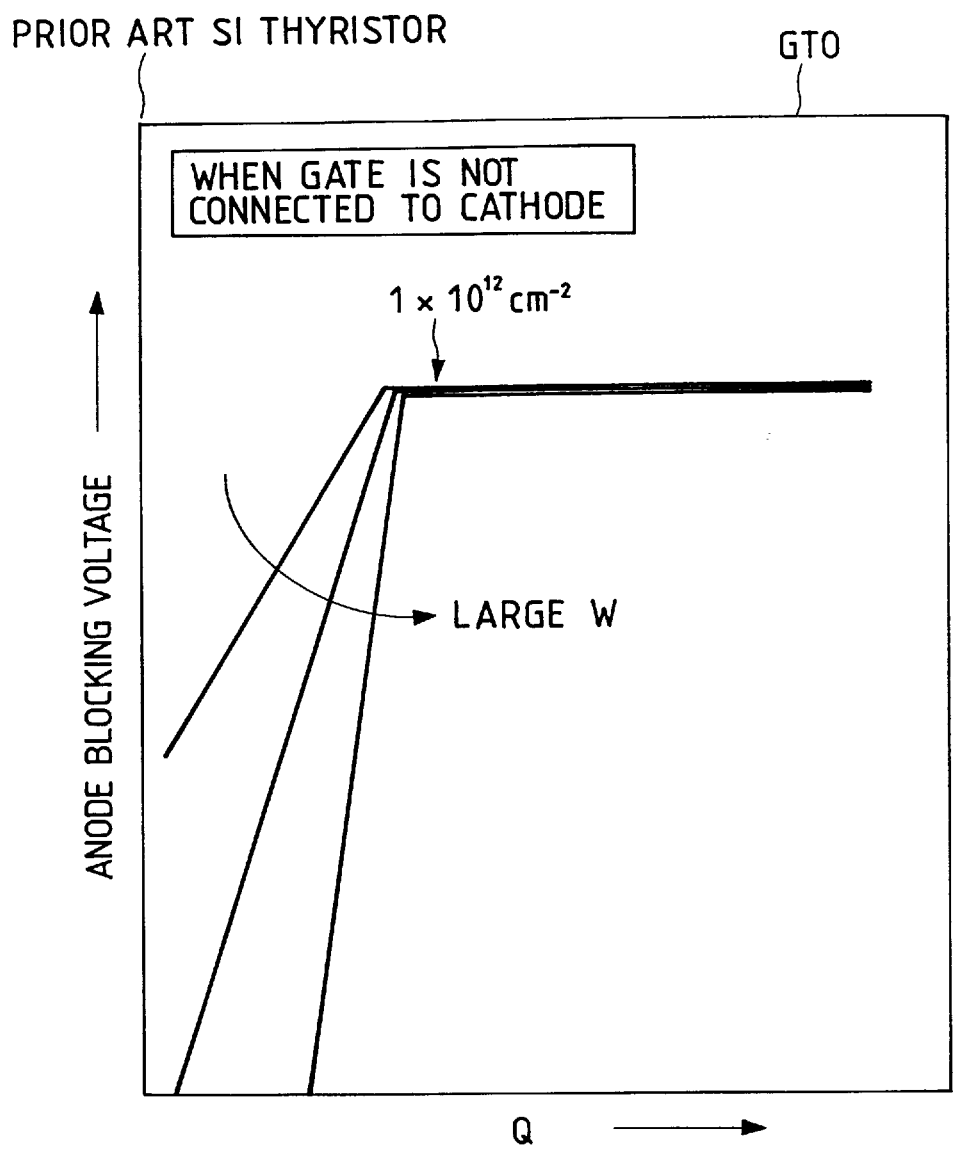
FIG. 5 is a graph representing the relationship between the total amount Q of impurities and the anode blocking voltage.

FIG. 5 is a graph representing the relationship between the total amount Q of the impurities in the p− layer 11 and the anode blocking voltage. The channel width is used as a parameter. It is assumed that the circuit between the gate and the cathode is opened. The conventional SI thyristor does not have the p− layer 11. Therefore, if an inverse bias voltage is not applied to the gate, it is difficult to form the potential barrier in the channel. Thus, if the circuit between the gate and the cathode is opened, it is possible to block the anode voltage if the channel width is very short, but the device goes in on-state, in other words, it has normally-on characteristics if the channel width is slightly long. As explained above, the blocking voltage of the conventional SI thyristor is extremely affected by the channel width. In the device in which the total amount Q of the impurities is larger than 0 $cm^{-2}$ ($Q>0$ $cm^{-2}$), or which is provided with the p− layer 11, the blocking voltage can be improved and the dependence of the blocking voltage to the channel width W is lessen. However, if the total amount Q of the impurities satisfies $Q<10^{12} cm^{-2}$, the depletion layer can easily reach the cathode n+ layer 9, that is, the device goes in a punch-through state. Accordingly, the blocking voltage is low. If the channel width is narrow, it is possible to prevent the punch-through. However, if the channel width is wide, it is impossible to prevent the occurrence of punch-through. On the contrary, as the total amount Q of the impurities increase, the distance of the potential barrier is increased. As a result, when the total amount Q satisfies the relation $Q \geq 10^{12} cm^{-2}$, the breakdown due to the punch-through diminishes and the blocking voltage is heightened. Therefore, as explained in detail, the blocking voltage will depend on the avalanche breakdown. In addition, the dependence of the blocking voltage to the channel width W is also lessened, because the pinching effect of the depletion layer between the neighboring gates is not required to prevent the punch-through. The anode blocking voltage is almost the same when the circuit is opened between the gate and the cathode as that when it is short-circuited, or when an arbitrary and applicable inverse voltage is applied between the gate and the cathode. In all cases, the normally-off characteristics are obtained. The blocking voltage characteristic of the device according to this embodiment is almost the same as that of the GTO. In addition, undesirable turn-on, such as, by dV/dt of the anode voltage or as a result of a leakage current is unlikely to occur, similarly as that of the GTO.

Now, if the blocking voltage depends upon the avalanche breakdown, there is an advantage in ease of use. According to the device of the present invention, the anode blocking voltage remains generally the same whether the gate is inversely biased or when the terminal of the gate is opened. It can therefore be said, the blocking voltage hardly depends upon the bias state of the gate. More strictly speaking, when the inverse bias is applied to the gate, the blocking voltage decreases by the corresponding voltage to the inverse bias of the gate. However, the blocking voltage difference due to the gate bias state is of the order, at most 5% of the rated blocking voltage. Therefore, in case of the fault of the gate circuit or the disconnection, the turn-on by mistake does not occur. Further, the malfunction by the short-circuit between the gate and the cathode does not occur.

Figure 6A:
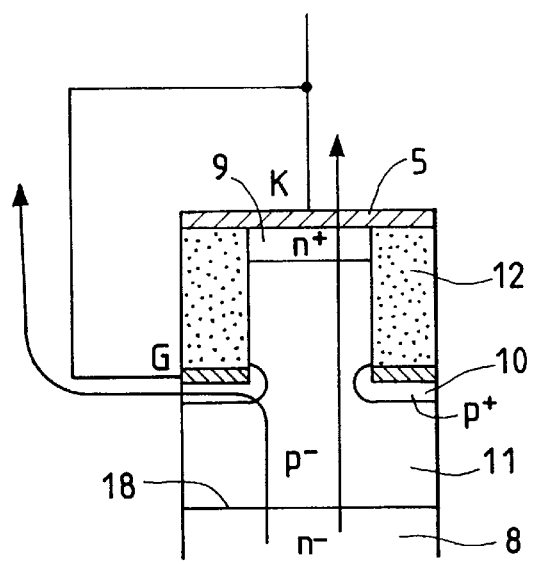
FIGS. 6A and 6B are schematic views illustrating an inner state of the device short-circuited between the gate and the cathode.
Figure 6B:
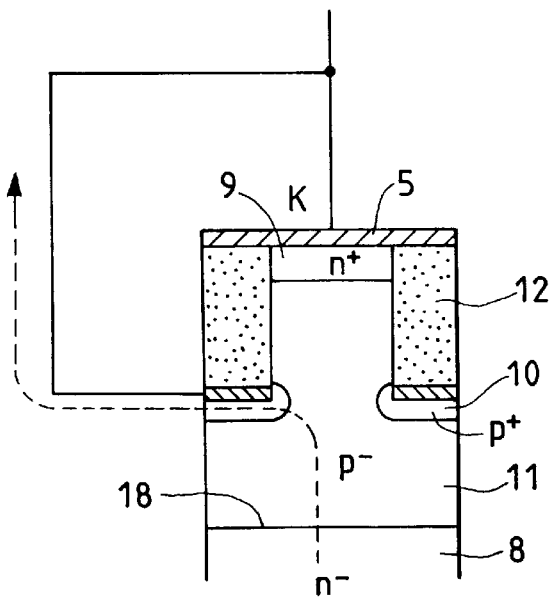

FIGS. 6A and 6B show inner states of the device short-circuited between the gate and the cathode. FIG. 6A shows the inner state of the device in which the total amount Q is smaller than that of the device according to the present embodiment. The depletion layer expanded from a pn junction 18 can easily reach the cathode n+ layer 9, in other words, it goes in the punch-through state. Therefore, the current as shown by the arrow of the solid line flows to the cathode electrode 5. Further, a current flows to the gate electrode 2 through the gate p+ layer. These currents flow in a state in which an amount of carriers is inadequate, that is, in an incompletely latched state in which the applied voltage of the anode is high. Therefore, in this operating condition, the dispatched heat can reach a dangerous level which can easily destroy the device. FIG. 6B shows the internal state of the device according to the present embodiment. Because the depletion layer does not come to punch through the cathode n+ layer, it is possible to block adequately the anode voltage even when the circuit is opened between the gate and the cathode. When the anode voltage is heightened to the breakdown voltage, the avalanche breakdown occurs. As a result, most of the avalanche currents flow to the gate as shown by an arrow of the dotted line. Therefore, even when the gate circuit operates abnormally, the device according to the present invention can block confirmly the anode voltage. Accordingly, the high reliability of the gate circuit and the simplification of the protective circuit can be attained.

The effect of the total amount Q of the impurities on the on-voltage and the turn-off loss will be explained hereinafter.

Figure 7A:
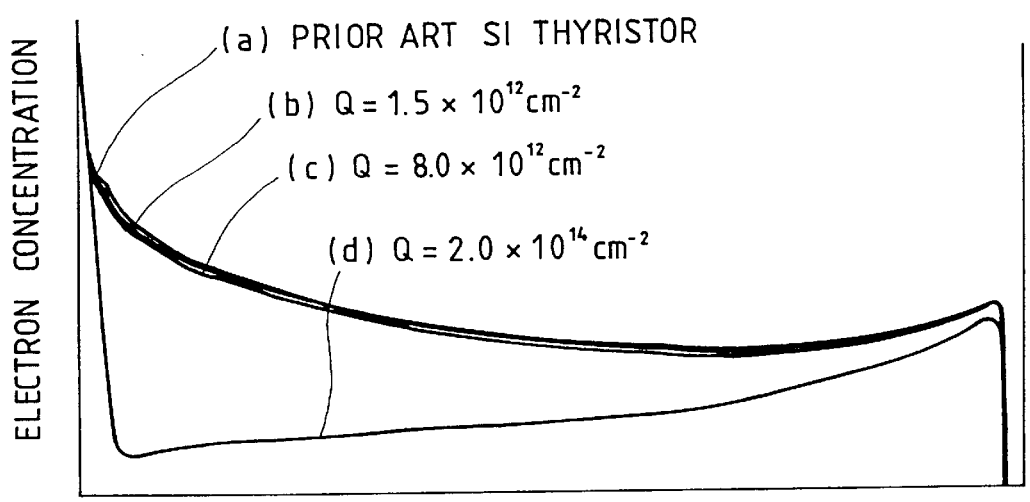
FIG. 7A is a graph representing the distribution of the impurity concentration in the vertical direction of the device or element and that of the electron concentration at the normally-on of the device or element as shown in FIGS. 7B and 7C.
Figure 7B:
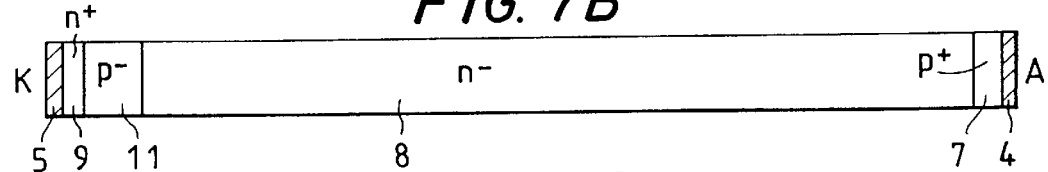
Figure 7C:
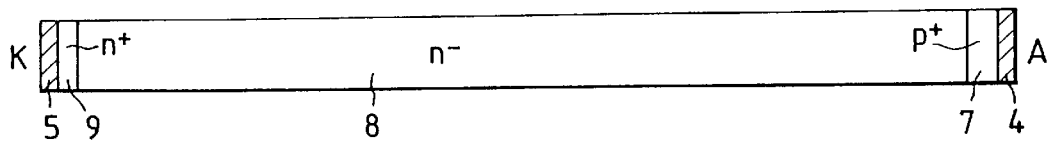

FIG. 7A is a graph showing the distribution of the impurity concentration in the vertical direction of the element and that of the electron concentration at the normally-on of the device. FIGS. 7B and 7C are schematic diagrams showing the state of the vertical direction of the device while FIG. 7A shows the electron concentration as it relates to each of the schematic diagrams. The lifetime of the n− layer 8 of the device is less than 10 $\mu s$. In FIG. 7A, (b) and (c) show the characteristics of the device according to the present invention which has the value of Q. The electron concentration of this device is almost the same as that of the conventional SI thyristor, shown in FIG. 7C, of which characteristic is shown at (a) in FIG. 7A. (d) in FIG. 7A shows the characteristic of the device in which the total amount Q of the impurities of the p− layer 11 is larger than that of the present embodiment, that is, $Q>10^{14} cm^{-2}$. The electron concentration of the p− layer 11 is very low, compared with other examples. Because the lifetime of carriers of the p− layer 11 becomes short as the total amount Q of the impurities of the p− layer 11 becomes large like this, the efficiency is deteriorated. That is, the electrons injected from the n+ layer 9 are transported to the p− layer 11 and then reach the n− layer 8 thereby resulting in an electron concentration which is reduced. In other words, in the conventional SI thyristor, the large injection efficiency of electrons from the n+ layer 9 to the n− layer 8, is deteriorated.

As can be seen from the carrier distribution of FIG. 7A, the relationship between the total amount Q of the impurities, the on-voltage and the turn-off loss can be explained. A so-called tail current which generates a large part of the turn-off loss is produced by the carriers in the neighborhood of the anode p+ layer 7 of this n− layer 8. Therefore, to decrease the carriers which exist herein is effective for decreasing of the turn-off loss.

In all cases of (a) to (d) of FIG. 7A, the amount of the carriers in the neighborhood of the anode p+ layer is almost the same, and the lifetime of the carriers of the n− layer 8 is almost the same. The turn-off loss is, therefore, almost the same. Next, the carrier distribution in the neighborhood of the p− layer 11 of the n− layer 8 will be discussed. In case of (d), the carrier concentration in the neighborhood of the p– layer 11 of the n– layer 8 is smaller. Therefore, the device with the characteristic (d) has a higher on-voltage than other examples. Namely, if the device with the characteristic (d) has the same turn-off loss as the other examples, it has a higher on-voltage than the other examples. Therefore, if the total amount Q of the impurities is larger than $10^{14}\text{cm}^{-2}$ as shown in FIG. 4A, the on-voltage becomes high. If the on-voltage is reduced to the same level as other examples by adjusting the lifetime of the carriers in the n– layer 8 of the device with the characteristic (d), the turn-off loss becomes larger than that of other devices. Therefore, if the total amount Q of the impurities is larger than $10^{14}\text{cm}^{-2}$ as shown in FIG. 4B, the turn-off loss becomes larger.

Figure 8:
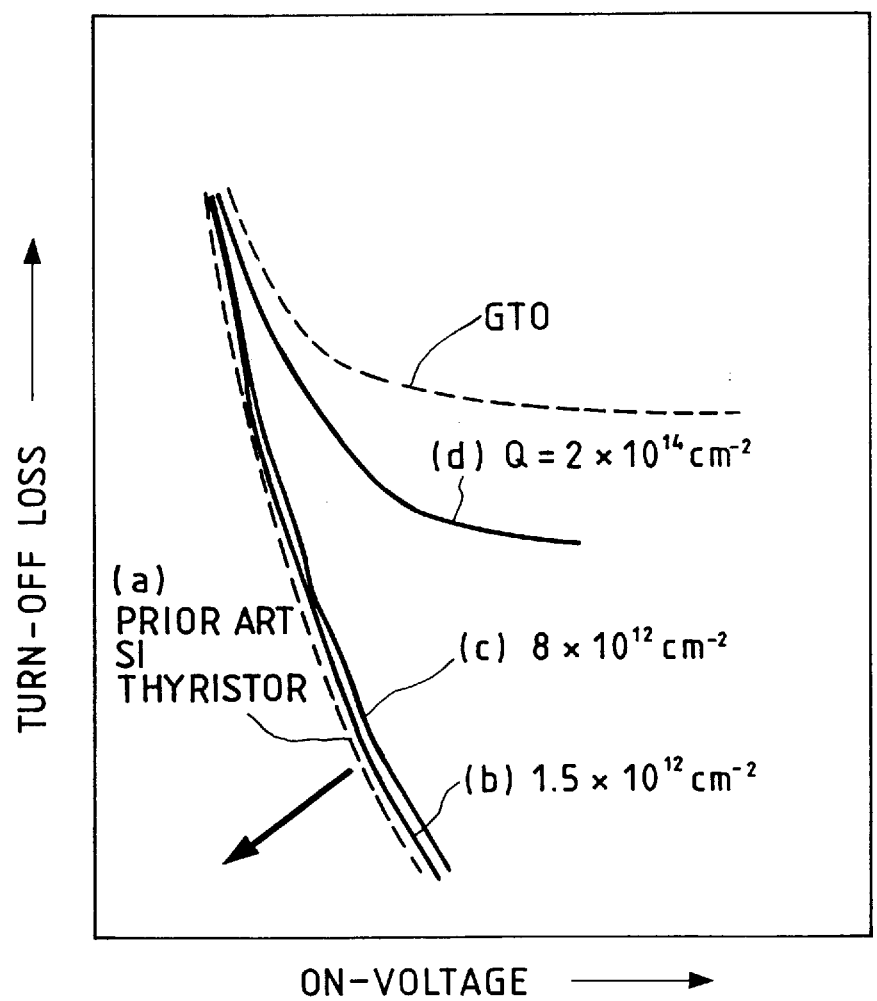
FIG. 8 is a graph representing the relationship between an on-voltage and a turn-off loss.

FIG. 8 is a graph showing the relationship between an on-voltage and a turn-off loss. The relationship is represented by using the lifetime of the carriers in the n– layer 8 as a parameter, with regard to each of the devices which have the total amount Q of the impurities in the p– layer 11. In case of the present embodiment (see (b) and (c)), the improved trade-off relationship can be obtained, which is almost the same as the conventional SI thyristor. The device according to the present embodiment has a small on-voltage in the range of the wide turn-off loss. The reason why the trade-off is improved will be explained hereinafter.

In FIG. 7 (e.g., FIGS. 7A–7C), the device according to the present embodiment has the carrier distribution in which the carrier concentration in the neighborhood of the p– layer 11 in the n– layer 8 is larger than that in the neighborhood of of the p+ layer 7 in n– layer 8. It is, thereby, possible to reduce both the on-voltage and the turn-off loss. Such the distribution of carrier concentration can be obtained by suppressing the injection amount of holes from the p+ layer 7 in the side of the anode, using the characteristic in which the injection efficiency of electrons from the cathode is high and using an anode-emitter shorting structure. Because the total amount of impurities of a p base in the conventional GTO is far larger than that of the device with the characteristic (d), if the life time of carrier is longer than that of FIG. 7 or 10 μs, the carrier distribution becomes similar to that shown at (d) of FIG. 7A. Therefore, the trade-off relationship between the turn-off loss and the on-voltage is deteriorated more than the device with the characteristic (d). If the life time is shortened less than 10 μs in the GTO of a 4.5 kV class, the device cannot be latched and cannot operate normally. According to the present embodiment, it becomes possible to apply the shorter lifetime of the carriers even in a high blocking voltage device as of 4.5 kV class. In the present embodiment, there is provided the silicon oxide film 14 for passivation on the side wall of the groove 12. this film acts to suppress the surface recombination in the side wall of the groove 12 and prevent the deterioration of the injection efficiency of electrons due to the shorter lifetime of the carriers. Further because the injection of the electrons is also affected by the thickness of the p– layer 11, it is desirable that the thickness of the p– layer 11 is less than 50 μm in case of $Q \leq 10^{13}\text{cm}^{-2}$.

As described above, it is possible to obtain the superior device in the loss by considering the total amount Q of impurities in accordance with the present invention. The less the total amount Q is, the less the turn-off loss in the switching losses is. Therefore, the means for decreasing the total amount Q is desirable. In order to obtain a function similar to the anode-emitter shorting structure, there may be provided an area in which the lifetime of carriers is lessened by proton radiation or by the formation of an n buffer layer. Further, the concentration of the anode p+ layer 7 may be set to less than $10^{18}\text{cm}^{-2}$. Alternatively, some combination of both may be applied.

It should be noted, it is advantageous, for achieving low loss, to set the total amount of Q to $10^{12}\text{cm}^{-2} \leq Q \leq 6 \times 10^{12}\text{cm}^{-2}$ and it is desirable, for achieving high reliability, to maintain an adequate anode blocking voltage by setting Q to a range of $6 \times 10^{12}\text{cm}^{-2} \leq Q \leq 1 \times 10^{13}\text{cm}^{-2}$.

Figure 9A:
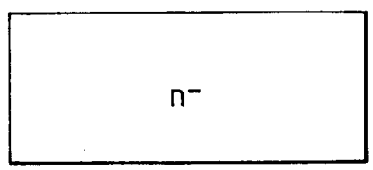
FIGS. 9A to 9J each is a schematic view of the step of a manufacturing process of the device.
Figure 9B:
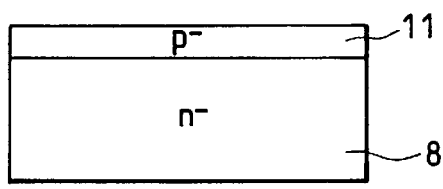
Figure 9C:
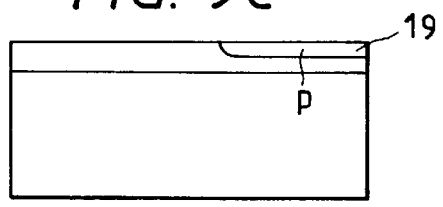
Figure 9D:
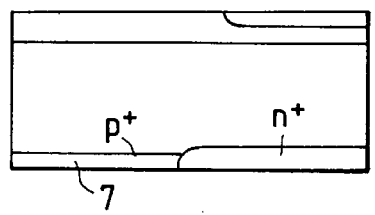
Figure 9E:
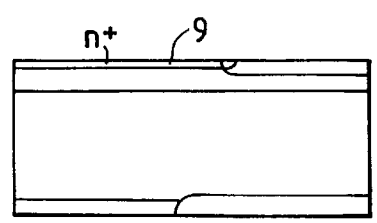
Figure 9F:
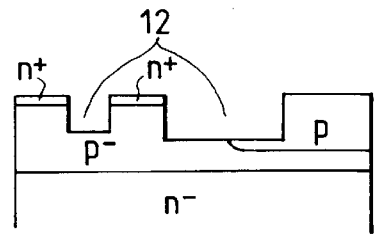
Figure 9G:
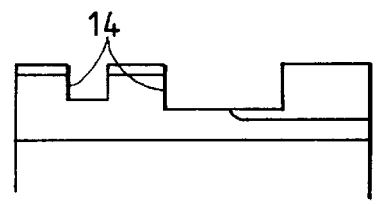
Figure 9H:
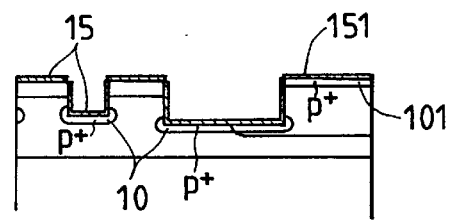
Figure 9I:
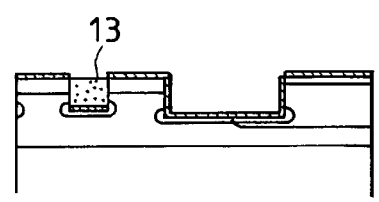
Figure 9J:
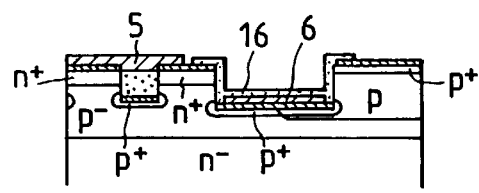

FIGS. 9A to 9J are schematic views of the steps of a manufacturing process of the device or element. An n type Si substrate is prepared (FIG. 9A), the p– layer 11 is formed by using thermal diffusion of p type impurities (FIG. 9B), and the p layer 19 in the periphery of the device is formed by thermal diffusion. After then, the p+ layer 7 in the anode side and the n+ layer are formed (FIG. 9D), and the n+ layer in the cathode side is formed (FIG. 9E). Next, the groove 12 is formed by anisotrophic dry etching (FIG. 9F). After forming the silicon oxide film, the anisotrophic dry etching is performed to the silicon oxide film, thus silicon oxide 14 is left in the side wall of the groove 12 (FIG. 9G). The gate p+ layer 10 is formed on the bottom of the groove by using the diffusion of the p type impurities, and the silicide layer 15 is formed self-alignedly on the exposed part of the Si (FIG. 9H). After forming the resin layer 13 by filling the groove in the segment with resin (FIG. 9I), the resin layer 16 is formed for surface protection of the electrode and the device (FIG. 9J). The device is completed after the lifetime control due to the irradiation of electron rays or γ rays and a packaging process. A p layer 19 in the periphery of the device has the impurities higher than the p– layer 11. Therefore, if the layer is formed by the diffusion due to the same thermal processing, the p layer 19 is formed more deeply, the resultant pn junction has a convex portion. It is not desirable for the blocking voltage. It is possible to adjust the diffusion depth of both layers by diffusing in advance only the p– layer 11 and to make the pn junction 18 to be flat. Even if the impurities of which the diffusion is faster than that of the p layer 19 are used as the impurities of the p– layer 11, this purpose is attained. In the examples of FIGS. 1 and 2, the p– layer 11 has been formed by ion-implanting boron(B) into the surface and diffusing the boron ions thermally. The desired p– layer 11 can be formed by adjusting the B dose amount. It may use Al(aluminium) or Ga (gallium) as the impurities of the p– layer 11. Further, it may form a diffusion source by the deposition, etc. Because even if there is the dispersion in the condition of the diffusion layer, a high performance device can be made stably, it is possible to use a variety of methods for forming the p– layer.

Figures 10A, 10B:
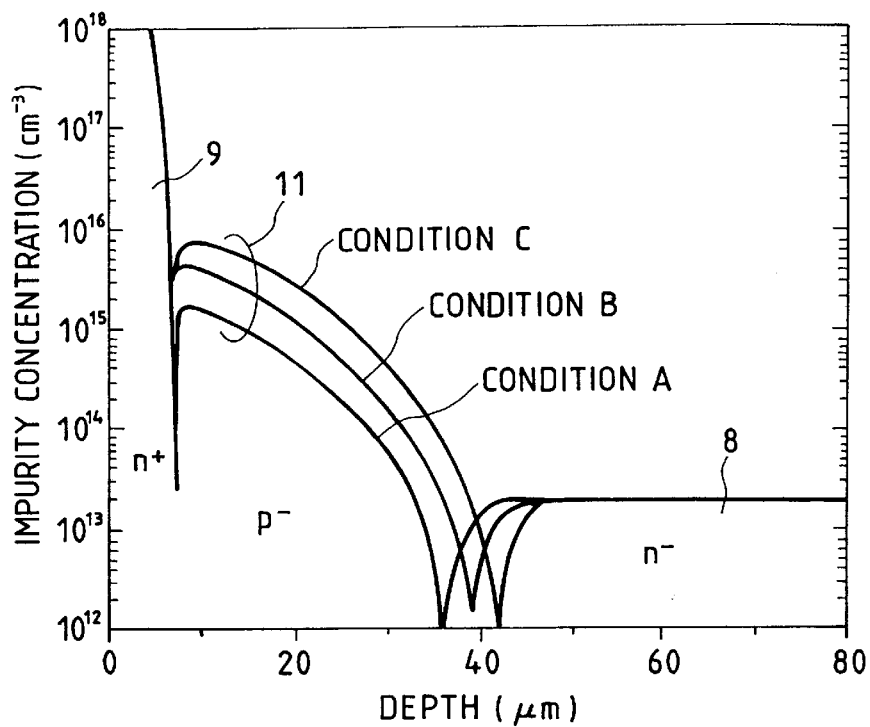
FIGS. 10A and 10B are a graph and a table showing an example of the impurity distribution of a p– layer produced by using the manufacturing process shown in FIGS. 9A to 9J and conditions thereof, respectively.

FIGS. 10A and 10B are a graph and a table showing an example of the impurity distribution of a p– layer produced by using the manufacturing process shown in FIGS. 9A to 9J and conditions thereof, respectively. The p-layer 11 and the gate p+ layer 10 show the distribution of impurities along the Gauss distribution. Thereby, it is possible to heighten the gate blocking voltage. In a condition C, the gate blocking voltage is 80 volts and in the other conditions, the range is 100 volts to 180 volts. The impurity total amount Q' and Q" and the dimension $I_2$ shown at table 1 are also important quantities for the characteristics. The effect of the desirable numeral range of the total amount Q' and Q" and the dimension $I_2$ will be explained next.

Firstly, the definition of Q" and Q" will be described. The definition of the $I_2$ has been already explained with respect to FIG. 3.

Figure 3E:
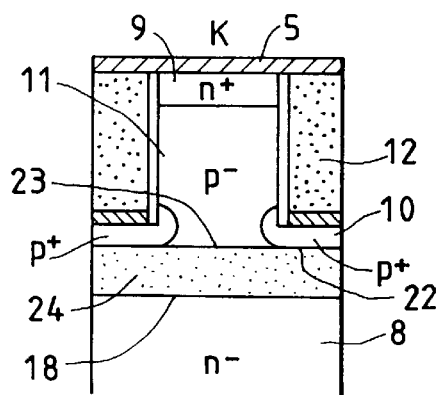

Numeral 22 of FIG. 3E designates a horizontal surface of a part of the gate p+ layer 10 nearest to the n– layer 8, and 23 a horizontal surface including the above horizontal surface. Numeral 24 designates an area of p– layer 11 in a direction of the n– layer 8 from the horizontal surface 23.

The total amount of the impurities in this region converted into the amount per unit area of cross section, is called as the total amount Q' of the impurities in the n– layer side of the p– layer 11.

Figure 3F:
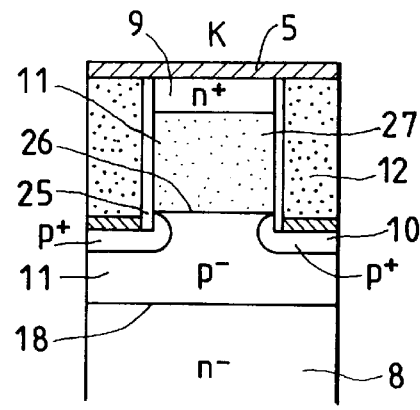

Numeral 25 of FIG. 3F designates a part of the gate p+ layer 10 nearest to the n– layer 8, and 26 a horizontal surface including the above horizontal surface. Numeral 27 designates an area of the p– layer 11 in a direction of the n+ layer 9 from the horizontal surface 26. The total amount of the impurities in this region converted into the amount per unit area of cross section, is called as the total amount Q" of the impurities in the n+ layer side of the p– layer 11.

The effect of the total amount Q' and Q" on the characteristics will be explained hereinafter.

Figure 11A:
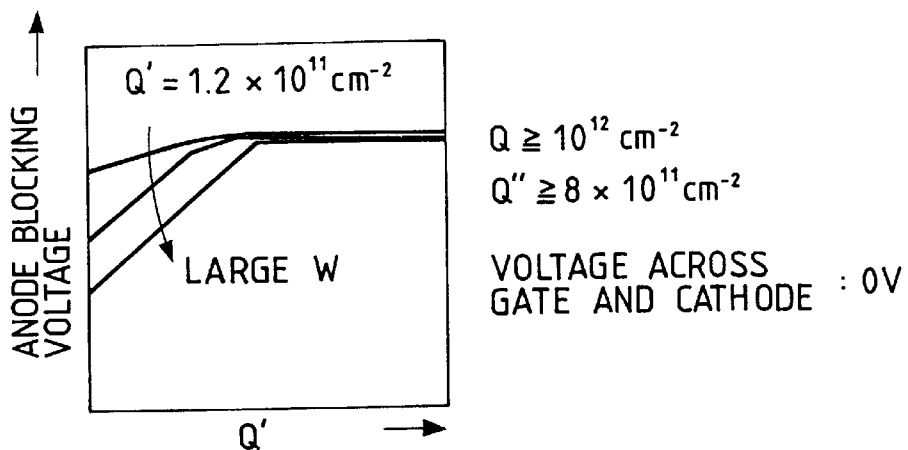
FIGS. 11A is a graph representing the relationship between the total amount Q' of impurities and the anode blocking voltage.

FIGS. 11A is a graph showing the relationship between the total amount Q' of impurities and the anode blocking voltage, in which the voltage between the gate and the cathode is 0 volt. If $Q' \geq 1.2 \times 10^{11} cm^{-2}$, the anode blocking voltage is heightened. In addition, the dependence of the blocking voltage on the width of a channel is lessened, where the deterioration of the blocking voltage which occurs in the $Q' < 1.2 \times 10^{11} cm^{-2}$ is mild compared with that in the $Q < 10^{12} cm^{-2}$. In other words, by setting to $Q' \geq 1.2 \times 10^{11} cm^{-2}$, such mild deterioration of the blocking voltage can be prevented, and by adding the condition $Q \geq 10^{12} cm^{-2}$, it is possible to definitely realize both a high blocking voltage and improvement in the yield of the device. The devices of FIGS. 11B and 11C also show a similar characteristic.

Figure 11B:
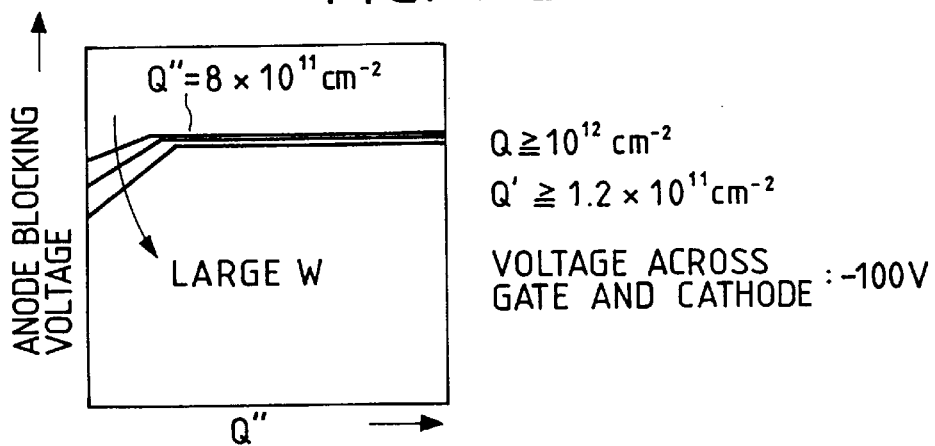
FIGS. 11B is a graph representing the relationship between the total amount Q" of impurities and the anode blocking voltage.

FIGS. 11B is a graph showing the relationship between the total amount Q" of impurities and the anode blocking voltage, where the voltage between the gate and the cathode is –100 V when an anode current is in a turn-off state. In order to improve the characteristic of the anode blocking voltage, it is important to suitably set the condition of Q". If $Q'' \geq 8 \times 10^{11} cm^{-2}$, the anode blocking voltage is heightened. In addition, the dependence of the blocking voltage on the width of a channel is lessened extremely.

Figure 11C:
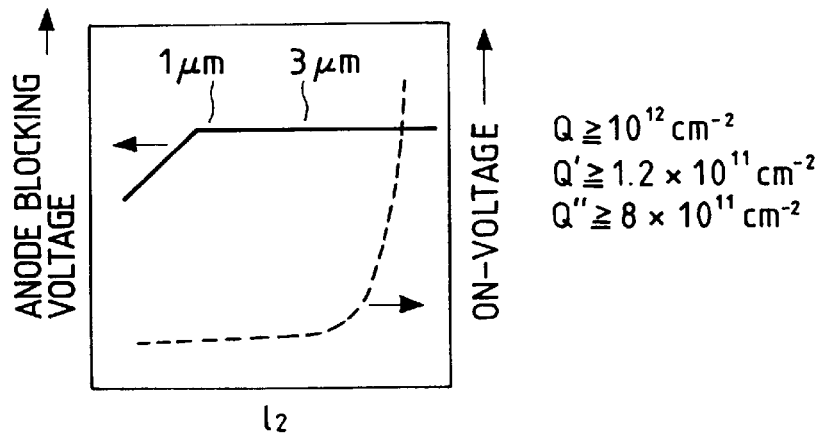
FIGS. 11C is a graph representing the relationship between the anode blocking voltage and the dimension $I_2$ of a p+ layer, and that between the on-voltage and the dimension I2.

FIGS. 11C is a graph showing the relationship between the anode blocking voltage and the dimension $I_2$ of a p+ layer, and that between the on-voltage and the dimension $I_2$. If Q, Q' and Q" are set to more than the predetermined value of the present invention and $1 \mu m \leq I_2 \leq 3 \mu m$, the anode blocking voltage is heightened and the on-voltage is suppressed to be low.

The mechanism which brings the dependence described above will be explained hereinafter.

Figure 12A:
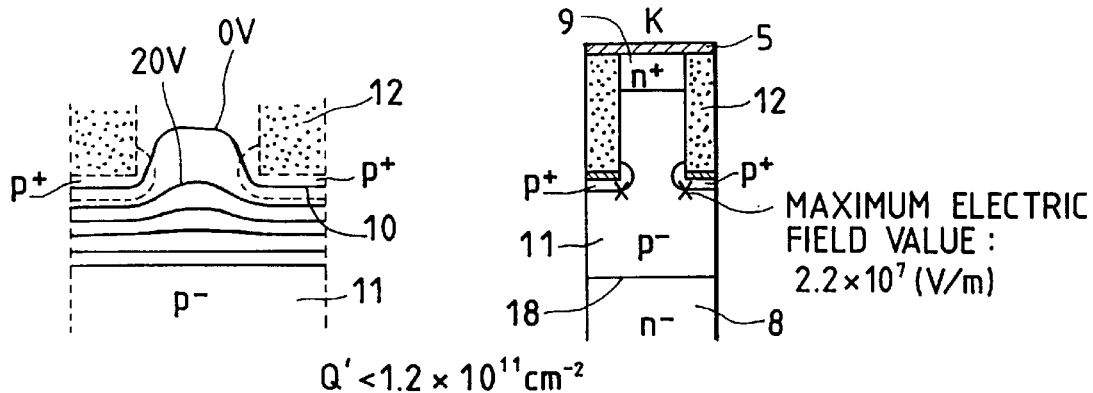
FIGS. 12A to 12C are illustrations of the mechanism of FIG. 11A.
Figure 12B:
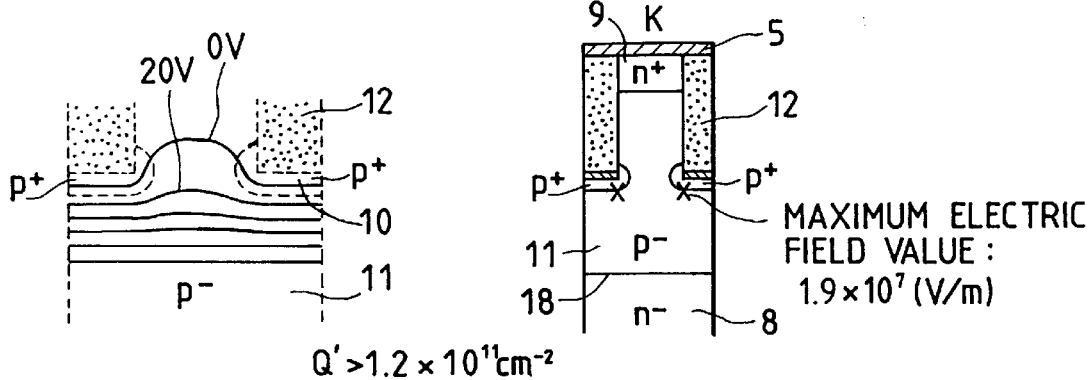
Figure 12C:
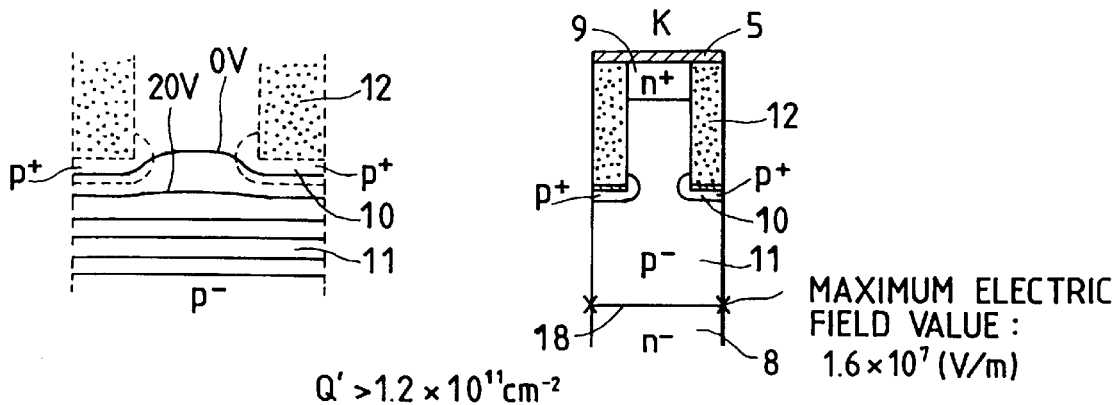

FIGS. 12A to 12C are illustrations showing the mechanism of FIG. 11A. They show the position where the distribution of the eqipotential line and the electric field is maximum when the anode voltage of the extent of 400 V is applied, where the circuit between the gate and the cathode is opened. FIG. 12A shows the case in which the total amount Q' of impurities is smaller than the predetermined range of the present embodiment. The electric field is maximum at the curved portion of the bottom of the gate p+ layer 10. Therefore, the avalanche breakdown is liable to occur therein. When the anode voltage is heighten a little beyond this state, the electric field reaches the limit value, the avalanche breakdown occurs, and it is difficult to prevent the higher anode voltage. The reason why the electric field is maximum is as follows.

The space charge region invaded from the pn junction 18 or the depletion layer reaches the curved portion of the bottom of the gate p+ layer 10, thereby the depletion layer is produced also in the gate p+ layer 10. Because the space charge density of the depletion layer in the gate p+ layer 10 is higher than that of the p– layer 11, the expansion of the depletion layer in the gate p+ layer 10 becomes less than that in the p– layer 11. Therefore, the equipotential line also is curved at the curved portion of the bottom of the p+ layer, and therefor, the electric field of this portion is strengthened. FIG. 12B shows the case that the total amount Q' of impurities is within the predetermined range, but it is relatively small. Because the total amount Q' is large compared with the case of FIG. 12A, the extending of the depletion from the pn junction 18 is lessened. Therefore, the imbalance of the distribution of the electric potential at the curved portion of the bottom of the gate p+ layer 10, that is, the curvature of the equipotential line is lessened. In addition, the amount of the space charges in the gate p+ layer is decreased. As compared with the case of FIG. 12A, the maximum electric field is lessened and the avalanche breakdown voltage or the blocking voltage is heightened. FIG. 12C shows the case that the total amount Q' of impurities is within the predetermined range, but it is relatively large. By the same reason as the case of FIG. 12B, the maximum electric field at the curved portion of the bottom of the gate p+ layer 10 is further lessened. The maximum electric field is produced in the pn junction 18. Under such a condition, the improvement of the blocking voltage is further confirmed. Under the condition of FIG. 12A, if the width of the channel is enlarged, the invasion of the depletion layer into the p-layer 11 is increased. Therefore, the curvature of the equipotential line is emphasized, namely, the maximum electric field is heightened. In the device according to the present invention of the cases of FIGS. 12B and 12C, the extending of the depletion layer is lessened and the dependence of the maximum electric field on the width of the channel is extremely lessened.

Figure 13A:
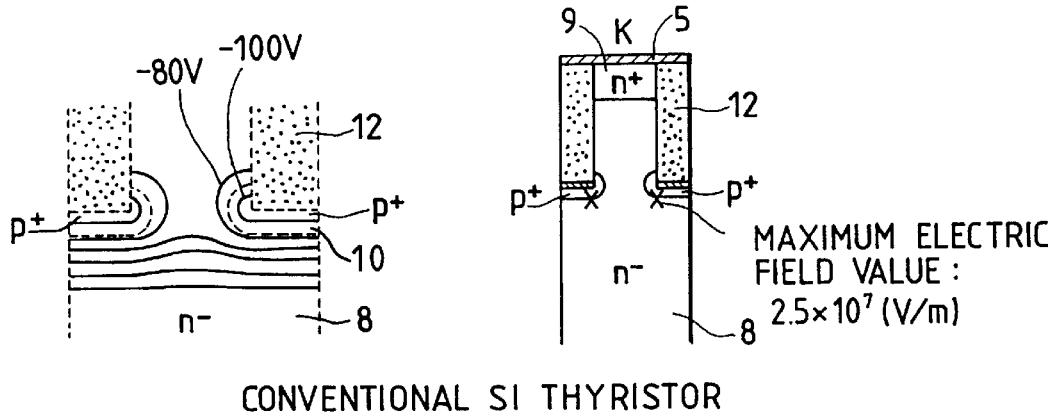
FIGS. 13A to 13C are illustrations of the mechanism of FIG. 11B.
Figure 13B:
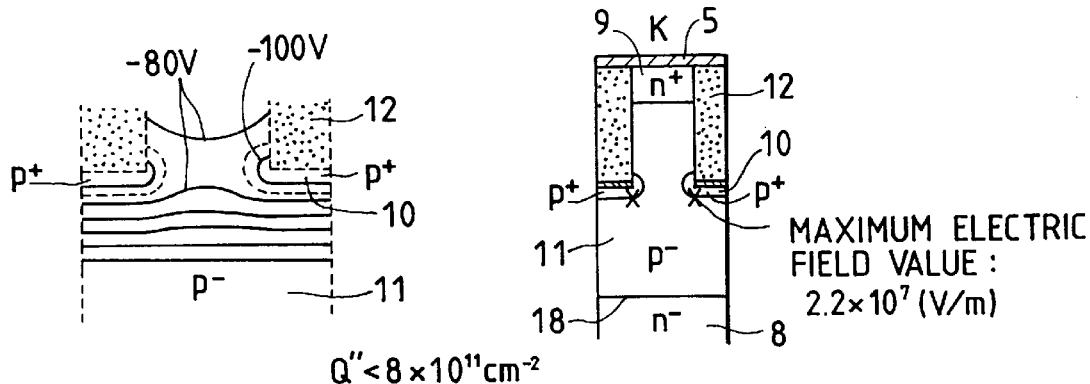
Figure 13C:
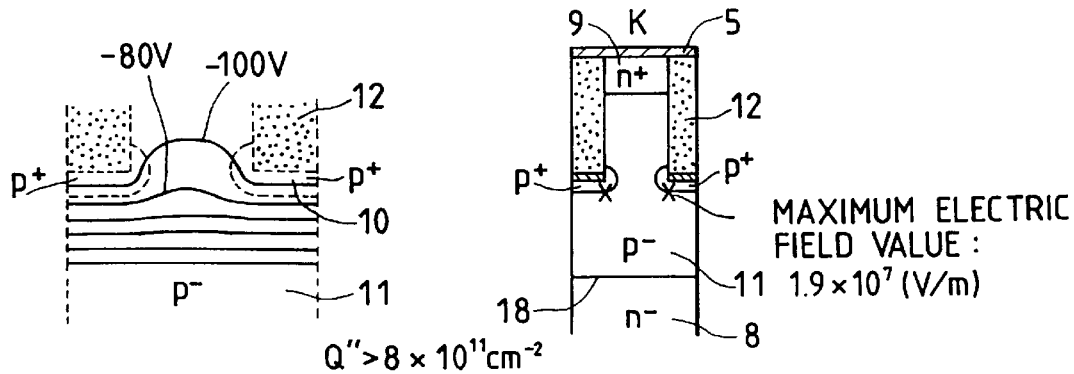

FIGS. 13A to 13C are illustrations showing the mechanism of FIG. 11B. These figures show the distribution of the equipotential line and the position where the electric field is maximum when the anode voltage more than 3000 V is applied, where the gate-cathode voltage is –100 V. FIG. 13A shows the case of the conventional SI thyristor which does not have the p– layer 11. It becomes possible to produce the potential barrier in the channel and prevent the higher voltage by applying the inverse bias voltage between the gate and the cathode even in the conventional SI thyristor. Because there the p– layer 11 is not present, the anode voltage is prevented by the curved pn junction which comprises the gate p+ layer 10 and the n– layer 8. Therefore, the equipotential line of the gate electric potential, –100 V and –80 V, is curved along the gate p+ layer. Accordingly, the maximum strength of the electric field exists in the p+ layer 10. FIG. 13B shows the case that the device has the p– layer 11, but the total amount Q" is smaller than the predetermined value of the present embodiment. Although there is provided the p– layer 11, the equipotential lines of the gate electric potential or –100 V are curved along the gate p+ layer 10 just like the case of FIG. 13A. Because the total amount Q" of impurities at the side of the n+ layer 9 in the p– layer 11 is smaller, the depletion layer or the electric field which expands from the pn junction comprising the p– layer 11 and the n+ layer 9, by the gate inverse bias voltage, is extended largely into the p– layer 11 and reaches the gate p+ layer 10. This depletion layer collides with another depletion layer from the pn junction 18. As a result, the equipotential line is curved largely along the gate p+ layer 10. Hereinafter, this phenomenon is referred to as a reverse pinch effect. If the total amount Q" of FIG. 13C is within the predetermined value of the present invention, all the equipotential lines cross the unit device. Therefore, as compared with the case of FIGS. 13A and 13B, the curvature of the equipotential line is smaller, that is, the maximum electric field is lessened. Because the total amount Q" of impurities is large in this case, the depletion layer due to the gate inverse bias does not reach the gate p+ layer 10, thus the reverse pinch effect does not occur. Therefore, the electric field is moderated, thus the anode blocking voltage is heightened. If the channel width W is increased under the condition of FIG. 13B, the extending of the depletion layer into the p– layer 11 due to the gate inverse bias is increased. As a result, the curvature of the equipotential line becomes large, that is, the maximum electric field is strengthened. In the device according to the present embodiment shown in FIG. 13C, the extending of the depletion layer into the p– layer 11 due to the gate inverse bias is lessened, thus the dependence of the maximum electric field on the channel width is substantially diminished.

The mechanism in which the dependence shown in FIG. 11C occurs will be explained hereinafter.

In the present embodiment, the maximum concentration of impurities of the gate is set to higher than $1 \times 10^{18} \text{cm}^{-2}$ in order to decrease the gate resistance. It is not desirable to increase the maximum concentration of impurities of the gate p+ layer 10 from the point of view of the anode blocking voltage. Because the difference between the expansion of the gate p+ layer 10 and that of the p– layer 11 is large when the concentration of the gate p+ layer 10 is high, the electric potential line extremely curves and the amount of the space charge in the gate p+ layer 10 increases. By this effect, it is easy to generate a large electric field at the curved portion of the bottom of the gate p+ layer 10. In order to weaken the electric field, it is required to make the depth 12 from the bottom of the groove 12 of the gate p+ layer 10 deep. Thereby, because the expansion in the lateral direction of the impurity diffusion in the gate p+ layer 10, the curvature of radius of the edge portion of the gate p+ layer 10 can be made large. As a result, the electric field is moderated. However, if the depth $I_2$ is too large, the on-voltage is unwillingly heightened. The reasons are as follows: (1) the distance in the vertical direction of the electric current passage is made longer, and (2) the area ratio of the current passage between the gate p+ layers 10 is lessened. The depth of the gate p+ layer 10, $1 \mu m \leq I_2 \leq 3 \mu m$, of the present embodiment is smaller than that of the conventional SI thyristor. Therefore, there is an advantage in a point of the low on-voltage of a device.

As described above, the maximum concentration of impurities of the gate p+ layer 10 is increased to higher than $1 \times 10^{18} \text{cm}^{-3}$ in the present embodiment. If the concentration of the gate p+ layer 10 is high, it is possible to decrease the contact resistance between the gate p+ layer 10 and the gate wiring layer 15 and decrease the parasitic resistance of the gate circuit. As a result, it becomes possible to allow confirmly and in a high speed a current to turn off. If the maximum concentration of impurities of the gate p+ layer 10 is heightened to more than $10^{19} \text{cm}^{-3}$, it is possible to form the ohmic-contact even by using an aluminium in which a metal silicide or silicon, as the gate wiring layer 15. Further, it is possible to decrease largely the parasitic resistance of the gate circuit by using only the gate p+ layer 10 as the gate wiring layer 15. In this case,different from the case in which the aluminium without additives is used, the migration of the gate wiring layer 15 can be suppressed. Therefore,the gate wiring can be finely formed in this case. The problem that occurs of the fault of the blocking voltage also can be solved, in which the fault is made by a spike pulse when the ohmic-electrode is formed. If the aluminium without additives is used as the gate wiring layer 15, there is an advantage that can lessen extremely the resistance of the gate wiring layer 15 itself. It is also effective to adopt the structure in which the aluminium that the metal silicide layer or silicon is added between the gate p+ layer and the aluminium layer without additives.

The numerical definition of the total amount Q', Q" and the depth $I_2$ has been described hereinbefore. In the present embodiment, the total amount Q of impurities is set to the smaller value compared with the p base layer 30 of a GTO in order to decrease the loss. Therefore, the depletion layer is relatively easy to extend into the p– layer 11. As a result, although the anode voltage is prevented by the plane pn junction 18, the equipotential line is curved and a large electric field is generated, which occurs an avalanche breakdown. Thereby, the blocking voltage is determined. Further, when a high inverse bias voltage is applied to the gate in order to satisfactorily carry out, at a high speed, the turn-off operation, avalanche breakdown is likely to occur due to the reverse pinch effect. Such a tendency cannot be found in the conventional GTO which also has the plane junction like the present invention. This tendency is lessened by using above numerical limitation of the total amount Q', Q" and the depth $I_2$, in which the blocking voltage is improved.

Some points to be noted in order to obtain a high blocking voltage will be explained hereinafter.

Firstly, it is required to make such a structure that a sufficient blocking voltage can be attained, for example, at the portion corresponding to the gate electrode 2 of FIG. 1A, that is, the peripheral region shown in FIG. 2A. Referring to FIG. 2A, the structure of a sectional surface of the peripheral region of the device will be explained. The side surface of the device is processed by a beveling machining. A p+ layer 101 and a silicide layer 151 are formed on the peripheral portion of the device in the forming process of the p+ layer 10 and the silicide layer 15. Because the concentration of the p– layer 11 is low, a channel is formed on the surface of the p– layer due to the MOS effect when only the p– layer 11 is formed on the peripheral portion. As a result, a leakage current between the anode and the cathode increases, and the anode blocking voltage deteriorates after a long time period of use. However, the p+ layer 101 has the function of preventing the formation of such the harmful channel. The formation of the channel is prevented confirmly by providing a p layer 19 which has the impurity concentration higher than the p– layer 11. Because the p layer 19 has the function of lessening the effect of charges outside of the device on the potential distribution inside of the device, it also can solve the problem that the anode blocking voltage deteriorates after a long time period of use.

It is also required to consider the moderation of an electric field at a position where the junction structure has the irregularity.

From FIGS. 1C and 2A, it is understood that the depth of the groove provided with the gate electrode 6 is different from that inside of the segment. This is because the etching rate is different according to the depth of the grooves when they are formed by using the anisotropic dry etching method. The difference of the depth of the grooves becomes large when the width of the grooves inside the segment is finely formed in order to increase the area ratio of the n+ layer 9 for the low on-voltage. The difference of the depth of the grooves brings that of the position in a vertical direction of the p+ layer 11. This means that the effective width of the channel becomes extremely long. Therefore, in the conventional SI thyristor without the p– layer 11, the unit device in the outermost part of the segment limits an anode voltage to a low one. In order to obtain a high blocking voltage by forming a pn junction in a plane which blocks the anode voltage with the p− layer 11, it is necessary to provide the pn junction between the p− layer 11 and the n− layer 8 in the n− layer 8 side from the bottom of the gate p+ layer 10 of the groove with the gate electrode 6, as shown in FIGS. 1C and 2A. The effective Q' is important, the quantity converted into the total amount of impurities of the region in the n− layer 8 side from the horizontal surface including the bottom of the gate p+ layer 10 of the groove with the gate electrode 6 in the low concentration layer, the p− layer 11, into the amount per unit area of cross section. It is advantageous for the blocking voltage to allow the effective Q' to be as large as possible, under the condition of $Q \leq 10^{14} cm^{-2}$, preferably $Q' \div 1.2 \times 10^{11} cm^{-2}$. The total amount Q" of impurities in the cathode 9 side of the low concentration layer, the p− layer 11, may be desirable to be $Q" \geq 8 \times 10^{11} cm^{-2}$. As described above, it is possible to finely form the width of the groove inside the segment into 10 μm. This contributes to the low on-voltage.

If the p− layer 11 is extremely more shallow than the p layer 19 in FIG. 2A, the anode blocking voltage is lessened by the effect of the convex shape of the bottom of the p layer 19. It is desirable to select the depth of the p− layer 11 and of the p layer 19 so that the depths are not different from each other, or to form the pn junction in a plane by making the p− layer 11 deeper than the p layer 19, as shown in FIG. 2A.

Figure 14:
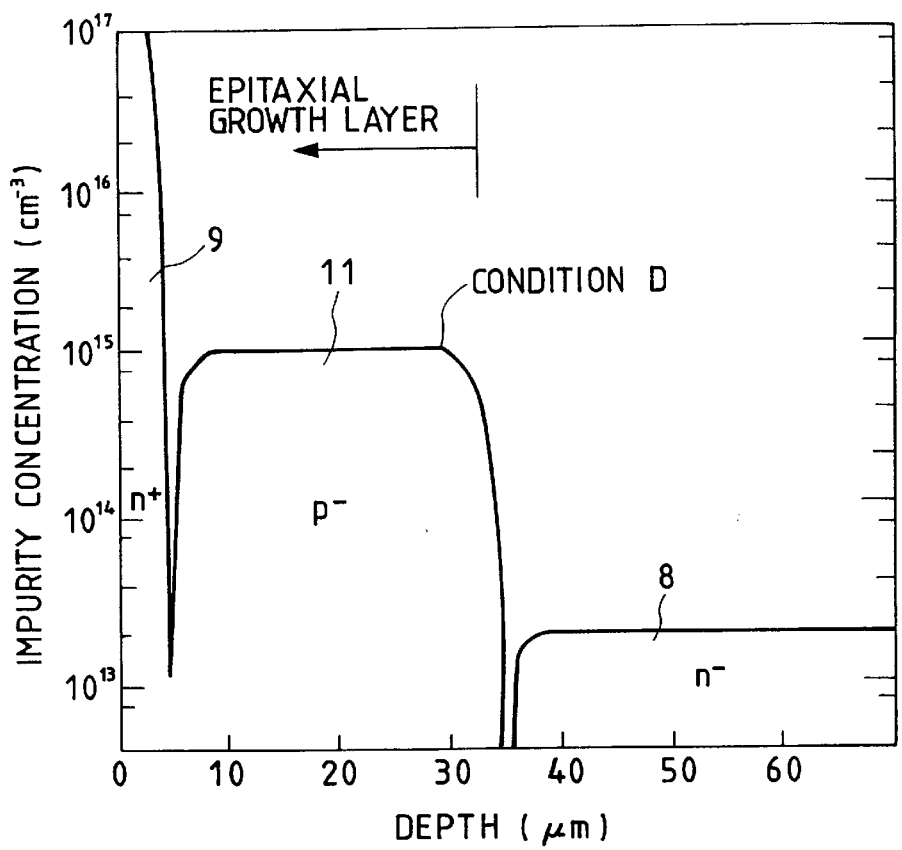
FIG. 14 is a graph representing the impurity distribution in a modification of the first embodiment.

FIG. 14 is a graph showing the impurity distribution in a modification of the first embodiment. While to form the groove and then to form the gate p+ layer on the bottom thereof is the same as the previous example, the p− layer 11 is formed by using the epitaxial growth in this example. The control of the total amount of impurities is easy, and the high gate blocking voltage is obtained easily by increasing the total amounts Q, Q' and suppressing the maximum impurity concentration.

An example of the plane pattern of the n+ layer 9 in the first embodiment will be explained hereinafter.

Figure 15A:
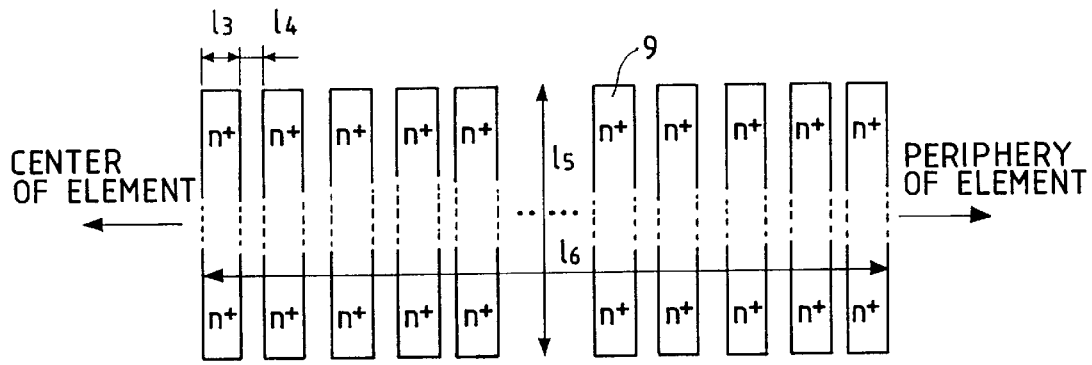
FIGS. 15A to 15C are views each showing a plane pattern of a cathode n+ layer.
Figure 15B:
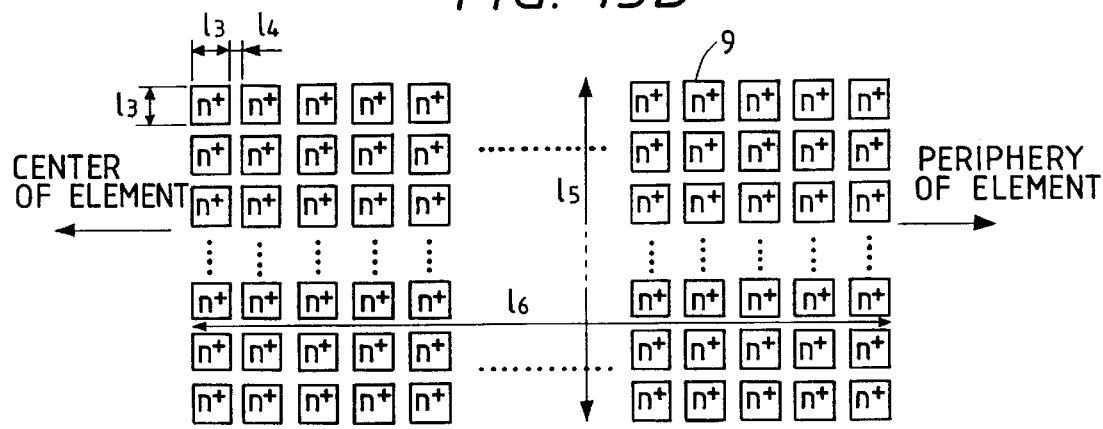
Figure 15C:
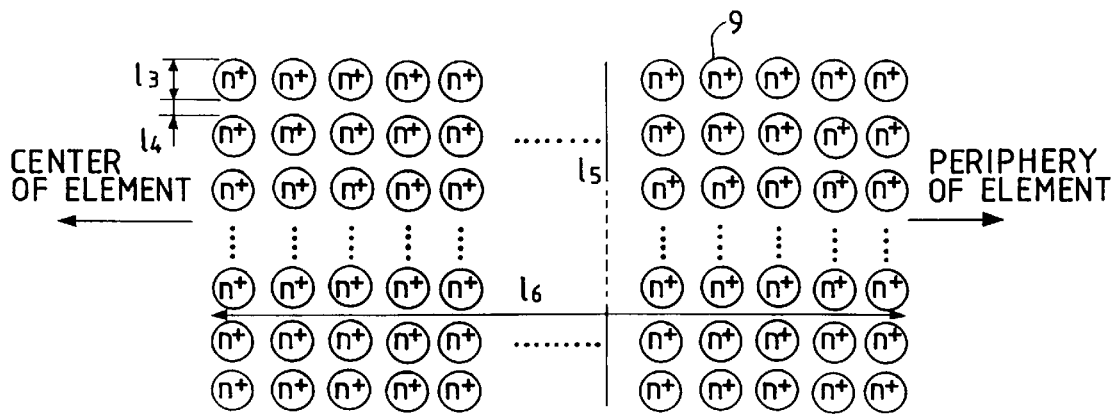

FIGS. 15A to 15C are views each showing a plane pattern of a cathode n+ layer, the portion marked by n+ designating the n+ layer, and other portions designating the grooves 12. The segment is constructed by the combination of the n+ layer 9. A plurality of segments is arranged in a radial direction of a disk-like device or element in a way similar to the conventional GTO. $I_5$ is in the range of several tens of μm to 300 μm, and $I_6$ is in the range of 1 mm to 4 mm. In FIG. 15A, one plane pattern is rectangular, in which it is possible to increase the area ratio of the n+ layer 9 and easily to obtain the high blocking voltage. In FIG. 15B, one plane pattern is square. Because the p+ layer 10 is in a higher density state compared with the example of FIG. 15A, it is easy to obtain the high blocking voltage and it is possible to realize a device with higher speed operation and a device with large turn-off capability. The making of a photo mask also is comparatively easy. In FIG. 15C, one plane pattern is circular. Because the p+ layer 10 has the highest density compared with the examples of FIGS. 15A and 15B, it is easy to obtain the highest blocking voltage. Because in either cases, the n+ width 13 is set to the range of several μm to several tens of μm and the p+ layer 10 of the bottom of the groove 12 is in a high density state, the extraction efficiency of holes from the gate when the device is turned off is superior. Therefore, it is possible to obtain a device with high speed operation and a device with large turn-off capability. It is desirable to select the width $I_4$ of the groove to the range of several μm to several tens of μm.

Figure 16A:
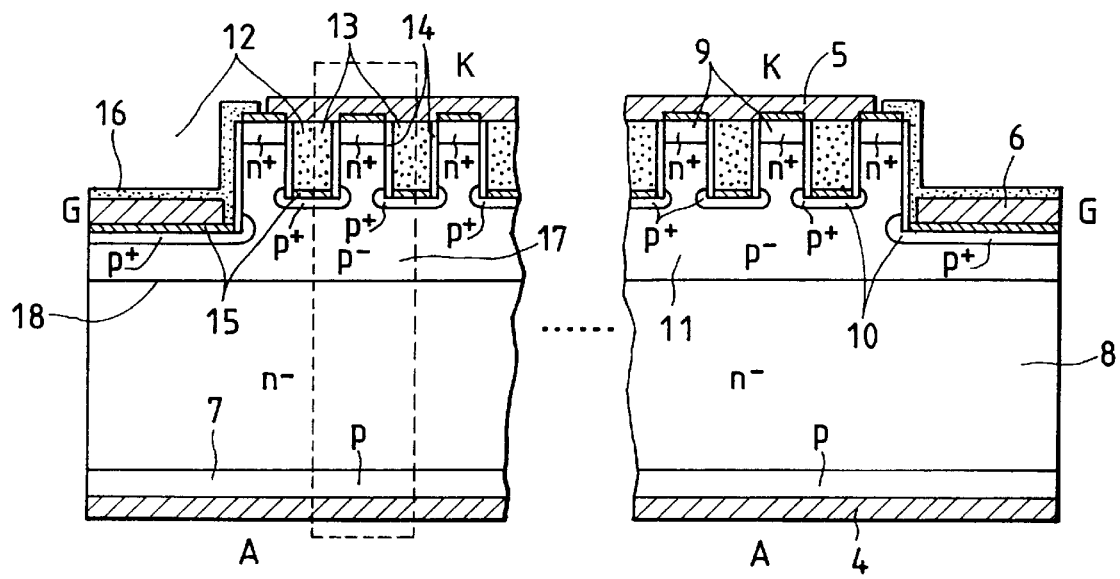
FIGS. 16A and 16B are views showing a modification of the first embodiment.
Figure 16B:
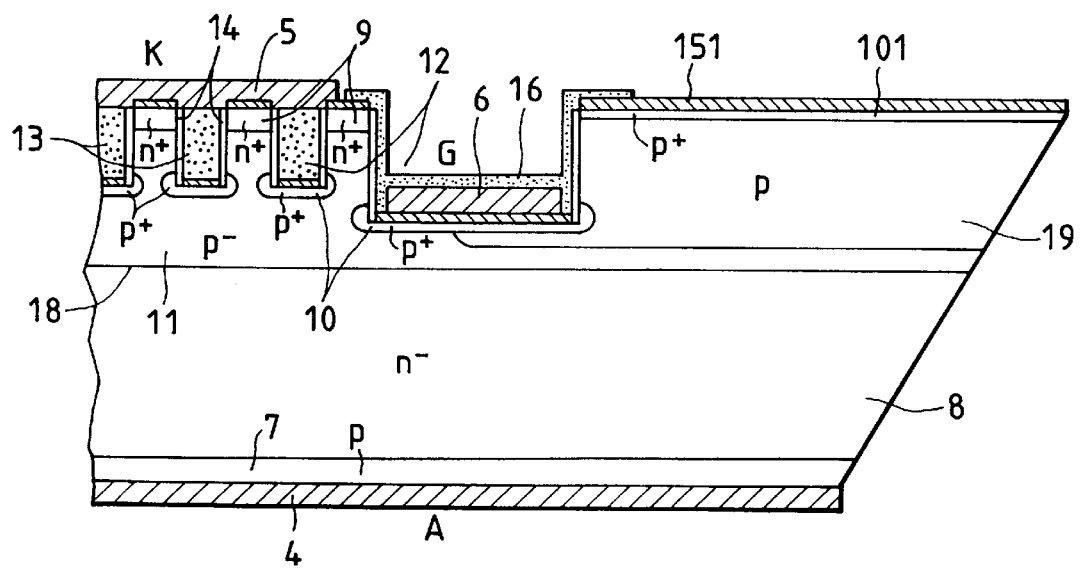

FIGS. 16A and 16B are views showing a modification of the first embodiment. In this modification, the anode p+ layer 7 (hereinafter, referred to as an anode p layer) is used instead of the anode-emitter shorting structure. The injection of the holes from anode p layer 7 to n− layer 8 is performed by lowering the impurity concentration of the anode p layer to less than $10^{18} cm^{-3}$. As a result, such a carrier distribution is obtained that the carrier concentration in the neighborhood of the p− layer 11 in the n− layer 8 becomes larger than that in the neighborhood of the anode p layer 7 in n− layer 8. If the impurity concentration of the anode p layer 7 is preferably in the range of $10^{16} cm^{13}$ to $10^{17} cm^{-3}$, there is effected an improvement in the trade-off between the on-voltage and the turn-off loss. Further, the turn-on is fast compared with the device having the anode-emitter shorting structure. This is because the injection of holes is started from all of the regions of the anode p layer 7 when turned on.

Figure 17A:
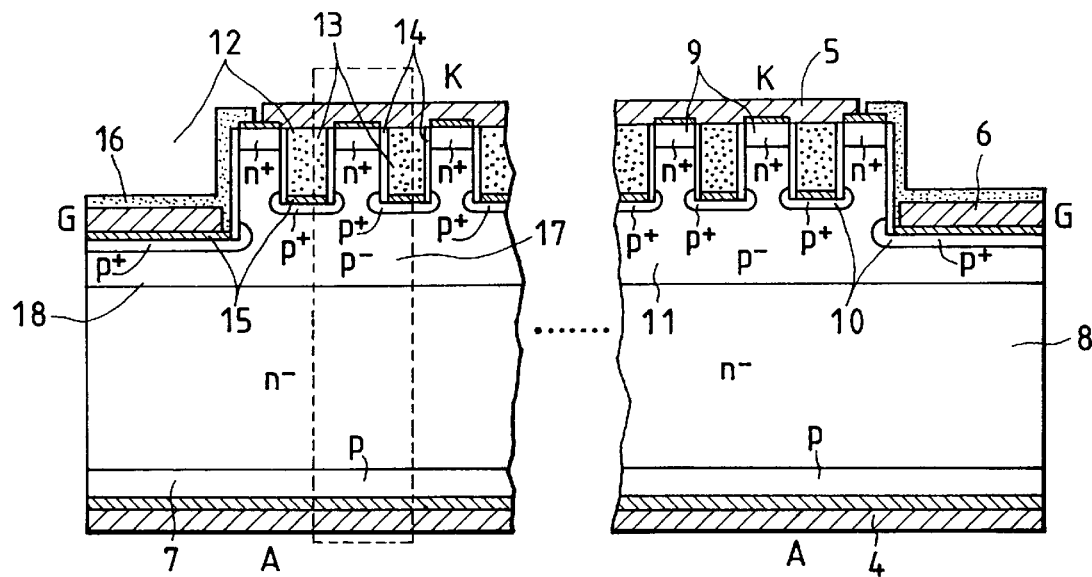
FIGS. 17A and 17B are views showing an example in which a silicide layer is inserted between an anode p layer and an aluminium layer of an anode electrode in FIG. 16.
Figure 17B:
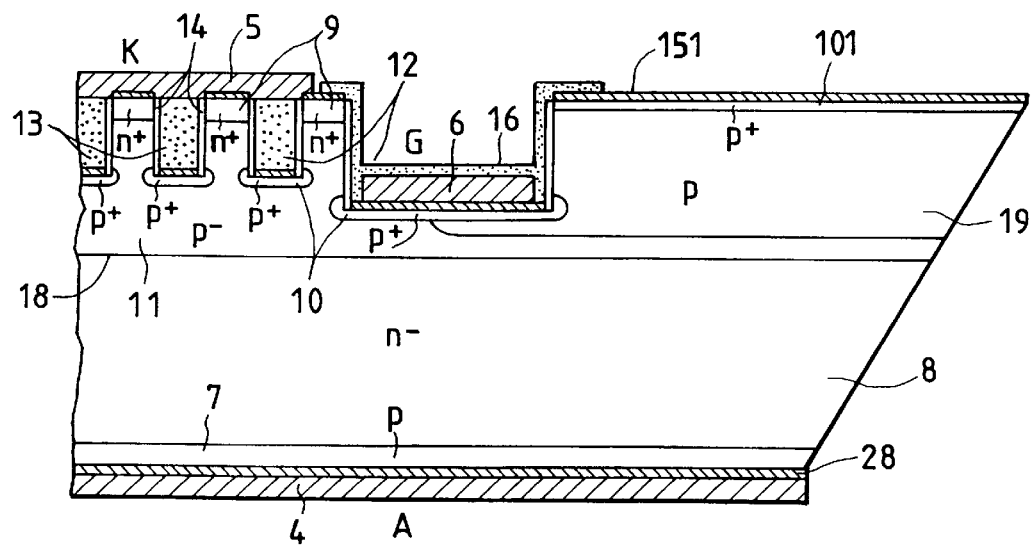
Figure 18A:
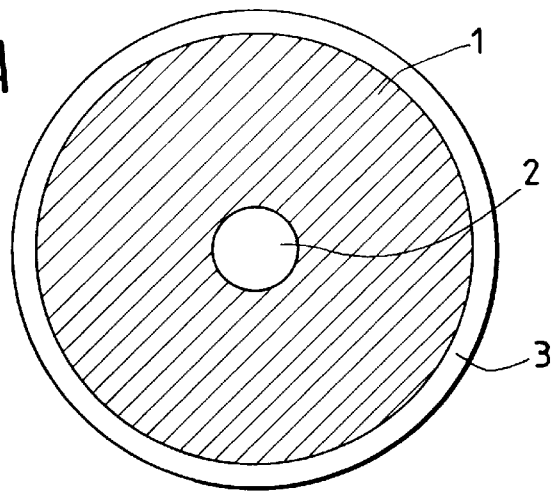
FIGS. 18A to 18C are views showing an element of a buried gate type according to a second embodiment.
Figure 18B:
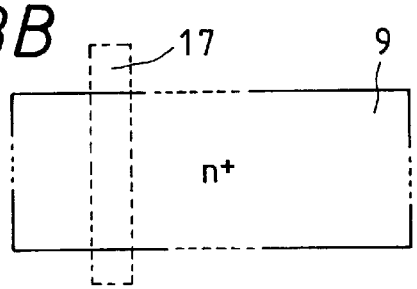
Figure 18C:
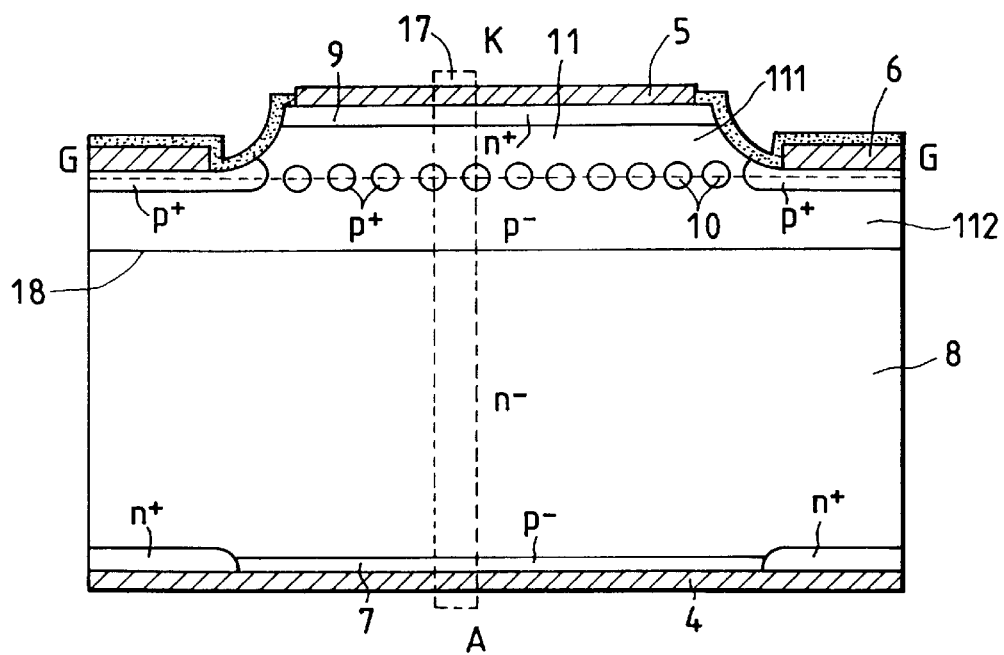

FIGS. 17A and 17B are views showing an example in which a silicide layer is inserted between an anode p layer and an aluminium layer of an anode electrode in FIG. 16. The silicide layer 28 forms a barrier for stopping the diffusion of aluminium from the aluminium layer 4, and prevents the diffusion of aluminium from the anode electrode aluminium layer 4 into the anode p layer 7. It is, therefore, easy to form the anode p layer with lower concentration. The aluminium with silicon added may be used as a material of the anode electrode 4, instead of the silicide layer 28.

(EMBODIMENT 2)

FIGS. 18A to 18C and FIGS. 19A to 19C are views showing an device of a buried gate type. The device of this type will be called as a second embodiment hereinafter. Also in this embodiment, the gate p layer is the p+ layer with high impurity concentration.

Because it has the buried gate p+ layer 10, the definition of the region of the gate p+ layer 10 is different from that in the first embodiment.

Figure 19A:
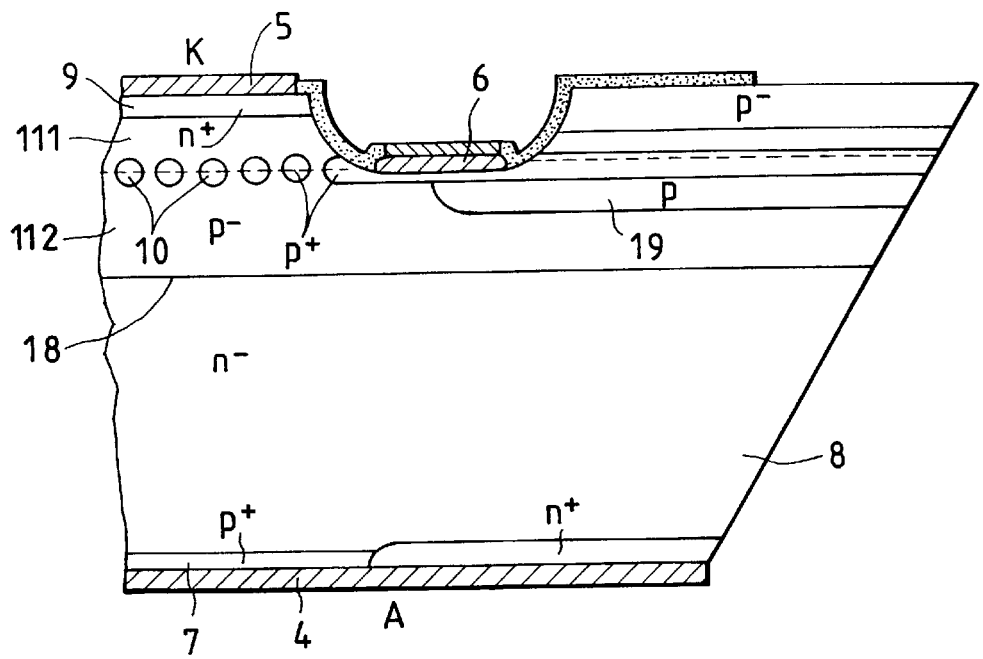
FIGS. 19A to 19C are views showing an element of a buried gate type according to a second embodiment.
Figure 19B:
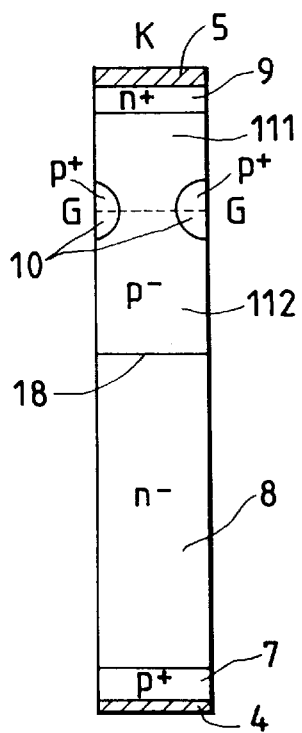
Figure 19C:
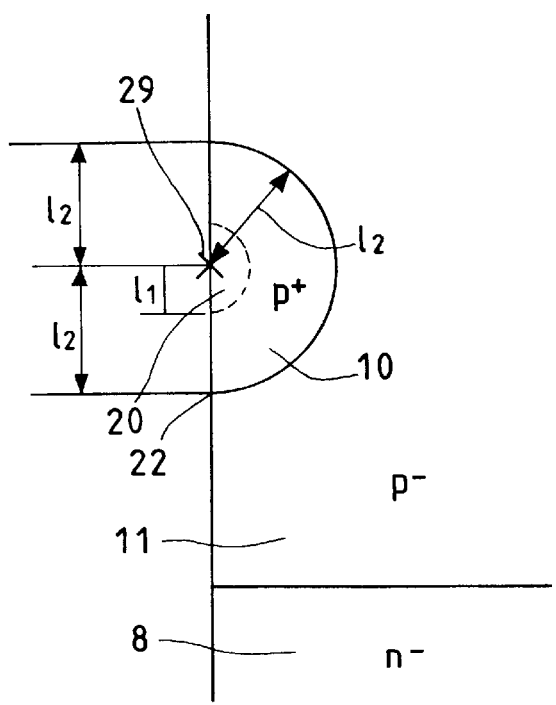

In FIG. 19C, numeral 29 designates the position where the impurity concentration in the gate p+ layer 10 is maximum. In this case, it is extremely narrow, so that it may be regarded as a point in fact. Numeral 20 designates the region where the impurity concentration is more than 1/10 one of the maximum concentration. $I_1$ designates the distance between the position 29 and the portion nearest to the n− layer 8 of the region 20. The region within the range of the distance $I_2=3 \times I_1$ from the center point 29 is defined as the gate p+ layer 10. On the basis of the definition of the gate p+ layer 10, the total amount Q, Q', Q" and the distance $I_2$ is set to the same values as the first embodiment.

Because the p− layer with low concentration is comprised of an epitaxial growth layer 111 and a diffusion layer 112 formed before the epitaxial growth, the total amounts Q, Q', Q" can be adjusted easily.

Figures 20A, 20B:
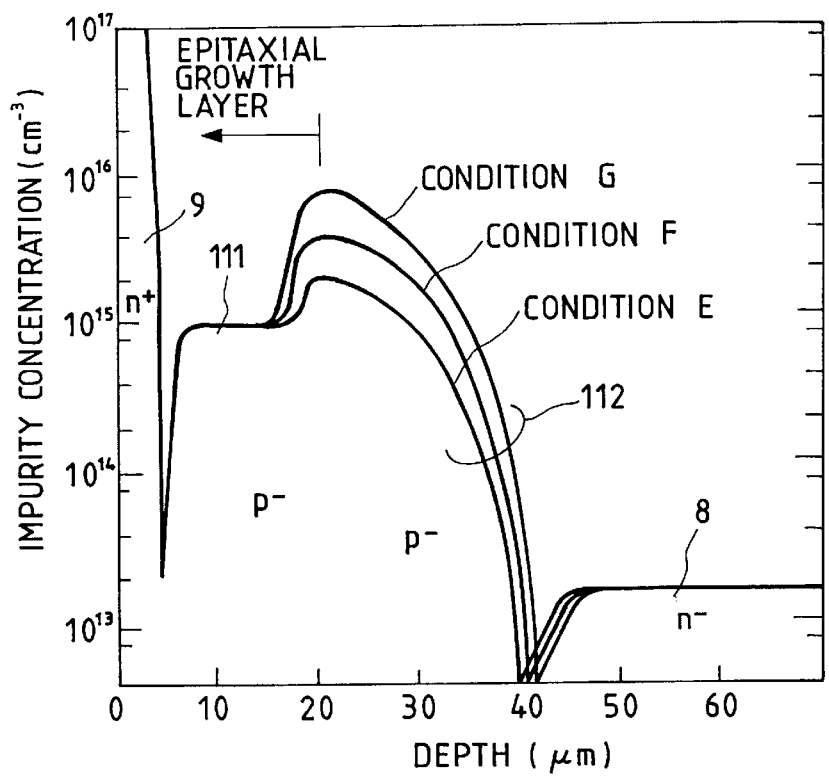
FIGS. 20A and 20B are a graph and a table showing an example of the impurity distribution of a p– layer and conditions thereof, respectively.

FIGS. 20A and 20B are a graph and a table showing an example of the impurity distribution of a p− layer and conditions thereof, respectively. The total amount Q' and Q" can be adjusted independently, namely, the Q' can be adjusted by the amount of the impurities of the diffusion layer 112, and the Q" by the amount of the impurities of the epitaxial growth layer 111. Accordingly, compared with the case of FIG. 10, it is easy to obtain the high gate blocking voltage and the high anode blocking voltage at the same time. The conventional SI thyristor of the buried gate type has large and harmful effects (the increase of the turn-on time and of an on-voltage, etc.) of auto-doping in which the impurities of the p+ layer 10 is diffused outside Si and re-diffused into the channel region. Because it is possible to maintain the high anode blocking voltage and to make the width of a channel long by providing the p− layer, the harmful effects of an out-diffusion are lessened. Thus it becomes possible to produce a large device with high efficiency.

(OTHER EMBODIMENTS)

FIGS. 21A to 21F, which show other embodiments of the present invention, are enlarged views in the neighborhood of the cathode 5 of the unit device. The cathode n+ layer and the gate p+ layer 10 is isolated from the n− layer 8 by the p− layer 11 in these devices. Further, the total amount of impurities in each portion of the p− layer,defined in a way similar to that of FIG. 3, is set to the value defined in the above embodiment.

Figure 21A:
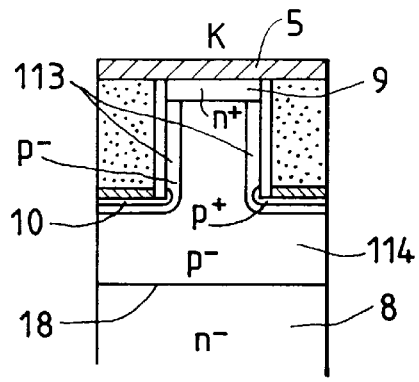
FIGS. 21A to 21F are views showing other embodiments of the present invention.

FIG. 21A shows the structure in which a slightly low concentration layer 113 is provided along the groove 12. The low concentration layer 113 moderates the electric field in the curved portion of the bottom of the gate p+ layer 10, and sometimes forms a current path. It is not required to make the gate p+ layer 10 thick, because of the moderating function of the electric field. It is provided just for the ohmic-contact with the gate wiring layer 15. As seen from the above, this device is effective in a view point of a lower on-voltage. Furthermore, the low concentration layer 113 acts to avoid the harmful effect due to the channel formed unwillingly on the surface of the side wall of the groove 12.

Figure 21B:
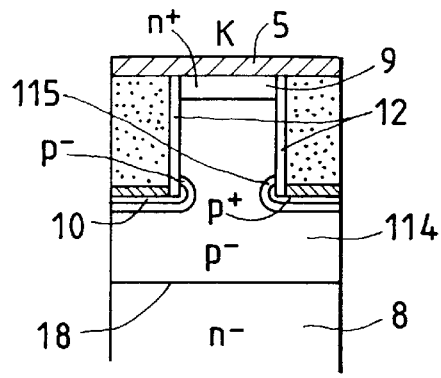

FIG. 21B shows the structure in which a slightly low concentration layer 115 is provided in the neighborhood of the bottom of the groove 12. The low concentration layer 115 acts in a way similar to that of FIG. 21B. It is advantageous for making the on-voltage low, because of the narrow low concentration layer.

Figure 21C:
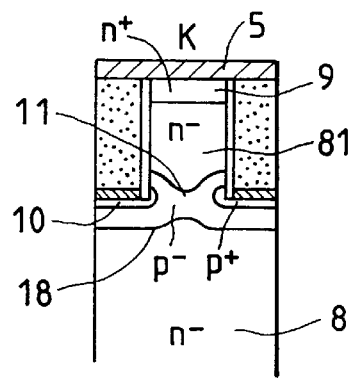

FIG. 21C shows the structure in which the p− layer 11 is diffused. It is possible to obtain a high blocking voltage, by making the thickness of the p− layer 11 thin and by making the concentration comparatively high. Because the p− layer 11 is thin, it is advantageous to make an on-voltage low. An n− layer 81 between the p− layer 11 and the n+ layer 9 is a portion of the n− substrate with low impurity concentration. Therefore, it is advantageous to make an on-voltage low as compared with the device as described later, in which the n− layer 81 is formed by the epitaxial growth. Because most of the depletion layer expands toward the n− layer 8, it is hard to effect a drop in the blocking voltage due to the reverse pinch effect.

Figure 21D:
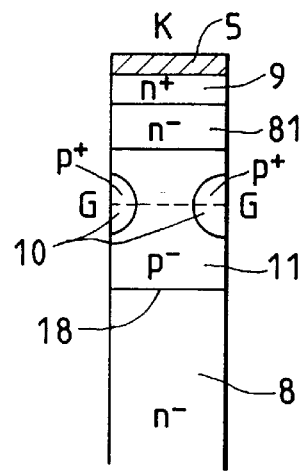

FIG. 21D shows a burried gate structure, in which the n− layer is provided between the p− layer 11 and the n+ layer 9. This embodiment also can make effectively a blocking voltage high and make an on-voltage low. In addition, because an pn junction can be formed in a plane, the high anode blocking voltage and the high gate blocking voltage can be obtained.

Figure 21E:
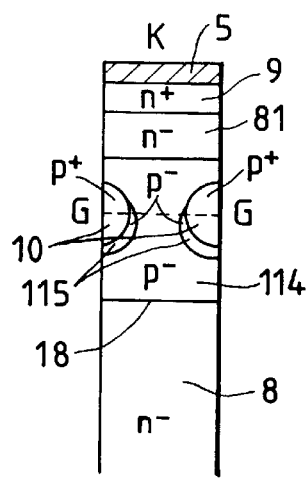

FIG. 21E shows a burried gate structure, in which a slightly low concentration layer 115 is provided along the burried gate layer 10. This structure is also effective to make an on-voltage low by the same reason as one of FIG. 21B.

Figure 21F:
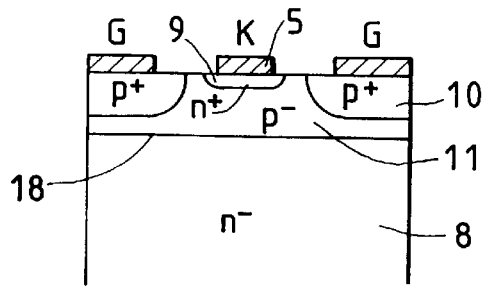

FIG. 21F shows a planar diffused gate type structure. According to this embodiment, it is easy to produce and it has a good yield. It is advantageous to make an on-voltage low in a device with a thin p− layer (11).

(EMBODIMENT OF THE POWER CONVERTER)

Figure 22:
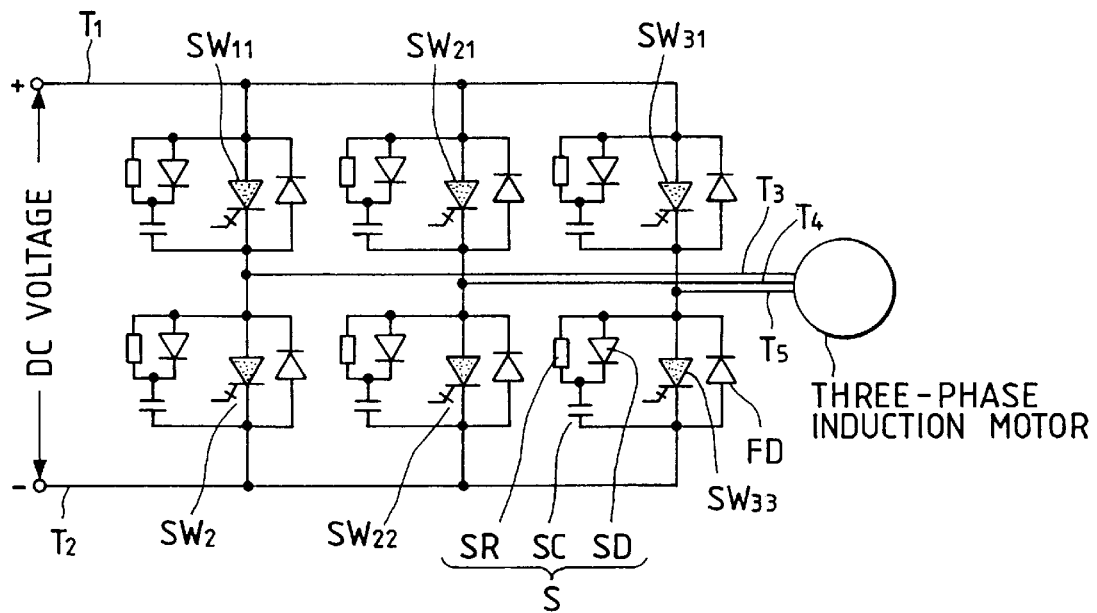
FIG. 22 is a circuit diagram showing an example of a power converter using the semiconductor device according to the present invention.

FIG. 22 is a circuit diagram showing an example of a power converter for a motor driving circuit, using the semiconductor devices ($SW_{11}$, $SW_{12}$, $SW_{21}$, $SW_{22}$, $SW_{31}$, $SW_{33}$) of the present embodiment 1 as switching elements.

FIG. 23A is a schematic view showing a conventional recessed gate type SI thyristor. FIG. 23B is a schematic view showing a conventional GTO. The inverter unit for one phase is constructed by connecting two switching elements (ex. $SW_{11}$ and $SW_{12}$) in series, in which a freewheeling diode FD is connected in inverse parallel to each of the switching elements. In addition, a so-called snubber circuit S is connected in parallel to each of the switching elements for protecting the switching element from the rapid rise-up of the voltage. This snubber circuit is constructed by connecting in series a parallel circuit of a diode SD and a resistor SR to a capacitor SC. The serial connection point of two switching elements in each phase is connected to one of the alternating current terminals ($T_3$, $T_4$, $T_5$). A three-phase induction motor is connected to the AC terminals. The anodes of the switching elements of the upper arm side are connected in common and are connected to a high voltage side of a DC voltage source at a DC terminal $T_1$. The cathodes of the switching elements of the lower arm side are connected in common and are connected to a low voltage side of a DC voltage source at a DC terminal $T_2$. The three-phase induction motor is driven by converting a DC to an AC due to switching operation. A gate circuit for controlling the switching operation is connected between a gate and a cathode of each switching element of the upper and the lower arm sides.

Because each of the switching elements has the characteristics of a high blocking voltage and a low loss, it is possible to produce the inverter equipment with a high blocking voltage and a high efficiency. Further, because a high performance device can be produced effectively, it is possible to realize a high performance system at a low cost. It should be noted that any semiconductor devices according to the present invention can be used in a power converter of the present invention and similar effects are obtained in such a modification.

While the invention has been particularly shown and described with reference to the semiconductor device of 4.5 kV class, it will be understood by those skilled in the art that the foregoing and other changes in form and details can be made therein without departing from the spirit and scope of the invention. Further, it will be appreciated that the conductivity type of each semiconductor device can be reversed.

We claim:

1. A semiconductor device comprising:
   a semiconductor substrate including a pair of main surfaces, a first semiconductor layer of a first conductivity type adjacent to a first one of the main surfaces, a second semiconductor layer of a second, opposite conductivity type of which impurity concentration is lower than that of said first semiconductor layer and which is adjacent to said first semiconductor layer, a third semiconductor layer of the first conductivity type adjacent to said second semiconductor layer, a fourth semiconductor layer of the second conductivity type of which impurity concentration is higher than that of said third semiconductor layer and which is adjacent to the second one of the main surfaces and said third semiconductor layer, and a fifth semiconductor layer of the first conductivity type, formed in said third semiconductor layer, of which impurity concentration is higher than that of said third semiconductor layer;
   one main electrode in ohmic-contact with said first semiconductor layer on the first main surface of said semiconductor substrate;
   another main electrode in ohmic-contact with said fourth semiconductor layer on the second main surface of said semiconductor substrate; and
   a control electrode connected electrically to said third semiconductor layer;

wherein the total amount of impurities of said third semiconductor layer between said second semiconductor layer and said fourth semiconductor layer is in the range of more than or equal to $10^{12} cm^{-2}$ and less than or equal to $10^{14} cm^{-2}$, wherein there is provided a groove selectively etched so as to reach said third semiconductor layer from the second main surface side through said fourth semiconductor layer, and wherein said control electrode is in ohmic-contact with the bottom of said groove.

2. A semiconductor device according to claim 1, wherein said fifth semiconductor layer is formed on the bottom of said groove, and wherein said control electrode is in ohmic-contact with said fifth semiconductor layer formed on the bottom of said groove.

3. A semiconductor device comprising:

a semiconductor substrate including a pair of main surfaces, a first semiconductor layer of a first conductivity type adjacent to a first one of the main surfaces, a second semiconductor layer of a second, opposite conductivity type of which impurity concentration is lower than that of said first semiconductor layer and which is adjacent to said first semiconductor layer, a third semiconductor layer of the first conductivity type adjacent to said second semiconductor layer, a fourth semiconductor layer of the second conductivity type of which impurity concentration is higher than that of said third semiconductor layer and which is adjacent to the second one of the main surfaces and said third semiconductor layer, and a fifth semiconductor layer of the first conductivity type, formed in said third semiconductor layer, of which impurity concentration is higher than that of said third semiconductor layer;

one main electrode in ohmic-contact with said first semiconductor layer on the first main surface of said semiconductor substrate;

another main electrode in ohmic-contact with said fourth semiconductor layer on the second main surface of said semiconductor substrate; and a control electrode connected electrically to said third semiconductor layer;

wherein the total amount of impurities of said third semiconductor layer between said second semiconductor layer and said fourth semiconductor layer is in the range of more than or equal to $10^{12} cm^{-2}$ and less than or equal to $10^{14} cm^{-2}$, and wherein said fifth semiconductor layer is a buried layer formed in said third semiconductor layer, and a distance between a portion of said fifth semiconductor layer nearest to said fourth semiconductor layer and one nearest to said second semiconductor layer is in the range of more than or equal to 2 μm and less than or equal to 6 μm.

4. A semiconductor device according to claim 1 or 3, wherein a sixth semiconductor layer of the second conductivity type of which impurity concentration is higher than that of said second semiconductor layer, is provided on said second semiconductor layer, and wherein said sixth semiconductor layer is short-circuited from said first main surface to said first semiconductor layer by said one main electrode.

5. A semiconductor device according to claims 1 or 3, wherein a sixth semiconductor layer of the second conductivity type having an impurity concentration higher than that of said second semiconductor layer, is provided between said first semiconductor layer and said second semiconductor layer.

6. A semiconductor device according to claims 1 or 3, wherein a sixth semiconductor layer of the second conductivity type having a lifetime of carriers lower than that of said second semiconductor layer, is provided between said first semiconductor layer and said second semiconductor layer.

7. A semiconductor device according to claim 6, wherein a maximum value of the impurity concentration of said first semiconductor is less than or equal to $10^{18} cm^{-3}$.

8. A power converter comprising a pair of direct current terminals; alternating current terminals the number of which is the same as the number of phases of an alternating current; and inverter units each of which includes two branched arms together connected in series between the pair of direct current terminals, each two branched arms being commonly connected to a different one of said alternating current terminals and each arm including a parallel circuit of a switching device and a diode in inverse polarity connection therewith, wherein said switching device comprises:

a semiconductor substrate including a pair of main surfaces, a first semiconductor layer of a first conductivity type adjacent to a first one of the main surfaces, a second semiconductor layer of a second, opposite conductivity type of which impurity concentration is lower than that of said first semiconductor layer and which is adjacent to said first semiconductor layer, a third semiconductor layer of the first conductivity type adjacent to said second semiconductor layer, a fourth semiconductor layer of the second conductivity type of which impurity concentration is higher than that of said third semiconductor layer and which is adjacent to the second one of the main surfaces and said third semiconductor layer, and a fifth semiconductor layer of the first conductivity type, formed in said third semiconductor layer, of which impurity concentration is higher than that of said third semiconductor layer;

one main electrode in ohmic-contact with said first semiconductor layer on the first main surface of said semiconductor substrate;

another main electrode in ohmic-contact with said fourth semiconductor layer on the second main surface of said semiconductor substrate; and a control electrode connected electrically to said third semiconductor layer;

wherein the total amount of impurities of said third semiconductor layer between said second semiconductor layer and said fourth semiconductor layer is in the range of more than or equal to $10^{12} cm^{-2}$ and less than or equal to $10^{14} cm^{-2}$, wherein there is provided a groove selectively etched so as to reach said third semiconductor layer from the second main surface side through said fourth semiconductor layer, and wherein said control electrode is in ohmic-contact with the bottom of said groove.

9. A power converter according to claim 8, wherein in each said switching device said fifth semiconductor layer is formed on the bottom of said groove, and wherein said control electrode is in ohmic-contact with said fifth semiconductor layer formed on the bottom of said groove.

10. A power converter comprising a pair of direct current terminals; alternating current terminals the number of which is the same as the number of phases of an alternating current; and inverter units each of which includes two branched arms together connected in series between the pair of direct current terminals, each two branched arms being commonly connected to a different one of said alternating current terminals and each arm including a parallel circuit of a switching device and a diode in inverse polarity connection therewith, wherein said switching device comprises:

a semiconductor substrate including a pair of main surfaces, a first semiconductor layer of a first conductivity type adjacent to a first one of the main surfaces, a second semiconductor layer of a second, opposite conductivity type of which impurity concentration is lower than that of said first semiconductor layer and which is adjacent to said first semiconductor layer, a third semiconductor layer of the first conductivity type adjacent to said second semiconductor layer, a fourth semiconductor layer of the second conductivity type of which impurity concentration is higher than that of said third semiconductor layer and which is adjacent to the second one of the main surfaces and said third semiconductor layer, and a fifth semiconductor layer of the first conductivity type, formed in said third semiconductor layer, of which impurity concentration is higher than that of said third semiconductor layer;

one main electrode in ohmic-contact with said first semiconductor layer on the first main surface of said semiconductor substrate;

another main electrode in ohmic-contact with said fourth semiconductor layer on the second main surface of said semiconductor substrate; and a control electrode connected electrically to said third semiconductor layer;

wherein the total amount of impurities of said third semiconductor layer between said second semiconductor layer and said fourth semiconductor layer is in the range of more than or equal to $10^{12} cm^{-2}$ and less than or equal to $10^{14} cm^{-2}$, and wherein said fifth semiconductor layer is a buried layer formed in said third semiconductor layer, and a distance between a portion of said fifth semiconductor layer nearest to said fourth semiconductor layer and one nearest to said second semiconductor layer is in the range of more than or equal to 2 $\mu$m and less than or equal to 6 $\mu$m.

11. A power converter according to claim 10, wherein each said switching device further comprises a sixth semiconductor layer of the second conductivity type having an impurity concentration higher than that of said second semiconductor layer, is provided on said second semiconductor layer, and wherein said sixth semiconductor layer is short-circuited from said first main surface to said first semiconductor layer by said one main electrode.

12. A power converter according to claim 10, wherein said switching device further comprises a sixth semiconductor layer of the second conductivity type having an impurity concentration higher than that of said second semiconductor layer, is provided between said first semiconductor layer and said second semiconductor layer.

13. A power converter according to claim 10, wherein said switching device further comprises a sixth semiconductor layer of the second conductivity type having a lifetime of carriers lower than that of said second semiconductor layer, is provided between said first semiconductor layer and said second semiconductor layer.

14. A power converter according to claim 13, wherein in said switching device a maximum value of the impurity concentration of said first semiconductor is less than or equal to $10^{18} cm^{-3}$.

* * * * *